US011063245B2

(12) United States Patent
Park et al.

(10) Patent No.: US 11,063,245 B2
(45) Date of Patent: Jul. 13, 2021

(54) DISPLAY APPARATUS

(71) Applicant: LG Display Co., Ltd., Seoul (KR)

(72) Inventors: ChooJin Park, Paju-si (KR); Eui-Doo Do, Paju-si (KR); Yongjae Kim, Paju-si (KR); JiYoung Ahn, Paju-si (KR); Dohong Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 75 days.

(21) Appl. No.: 16/712,214

(22) Filed: Dec. 12, 2019

(65) Prior Publication Data

US 2020/0194729 A1    Jun. 18, 2020

(30) Foreign Application Priority Data

Dec. 14, 2018 (KR) .......... 10-2018-0161895
Oct. 15, 2019 (KR) .......... 10-2019-0127661

(51) Int. Cl.
*H01L 51/52* (2006.01)
*H01L 27/32* (2006.01)
*F21V 8/00* (2006.01)

(52) U.S. Cl.
CPC ........ *H01L 51/5281* (2013.01); *G02B 6/0078* (2013.01); *H01L 27/322* (2013.01)

(58) Field of Classification Search
CPC .............. H01L 51/5281; H01L 27/322; H01L 51/5271; H01L 51/5284; H01L 2251/5307; H01L 27/326; H01L 51/5262; H01L 27/3244; G02B 6/0078
See application file for complete search history.

(56) References Cited

U.S. PATENT DOCUMENTS

2005/0116635 A1    6/2005  Walson et al.
2017/0263895 A1*   9/2017  Lee .............. H01L 27/3262
2018/0151120 A1*   5/2018  Kim ............. G09G 3/3258

FOREIGN PATENT DOCUMENTS

KR    10-2006-0113981 A    11/2006

* cited by examiner

*Primary Examiner* — Donald L Raleigh
(74) *Attorney, Agent, or Firm* — Birch, Stewart, Kolasch & Birch LLP

(57) ABSTRACT

A display apparatus can include a substrate having a light emitting area, a light emitting device disposed at the light emitting area on the substrate, at least one light exiting area disposed in the light emitting area, a light blocking layer disposed at the light emitting area and overlapping the at least one light exiting area, and a light guide part disposed at the light emitting area and configured to guide light generated in the light emitting device to the at least one light exiting area.

29 Claims, 17 Drawing Sheets

DISPLAY APPARATUS

CROSS-REFERENCE TO RELATED APPLICATIONS

This application claims the priority benefit of the Korean Patent Application No. 10-2018-0161895 filed on Dec. 14, 2018 and the Korean Patent Application No. 10-2019-0127661 filed on Oct. 15, 2019, all of these applications are hereby incorporated by reference as if fully set forth herein into the present application.

BACKGROUND

Field of the Invention

The present disclosure relates to a display apparatus.

Discussion of the Related Art

Display apparatuses have widely been used as display screens of notebook computers, tablet computers, smartphones, portable display apparatuses, or portable information devices, and the like, as well as display screens of televisions or monitors.

A light emitting display apparatus of a related art has a problem that pixel electrodes of a plurality of subpixels emit light and simultaneously reflect external light, thereby deteriorating reflection visibility. When the area of the pixel electrode is increased to improve the luminous efficiency of the light emitting display apparatus, external light reflectance also increases which in turn deteriorates reflection visibility.

In addition, the light emitting display apparatus of the related art can prevent reflection of external light to some extent by combining a separate optical film or polarizing film on a display panel, but such an optical film or polarizing film disadvantageously incurs high cost. In addition, the light emitting display apparatus of the related art has a problem that combining the separate optical film to the display panel is not sufficient to minimize reflectance of external light.

SUMMARY

An aspect of the present disclosure is directed to providing a display apparatus capable of improving luminous efficiency and minimizing external light reflectance.

Another aspect of the present disclosure is directed to providing a display apparatus capable of improving luminous efficiency and minimizing external light reflectance without a separate polarization layer or a circularly polarized light converting layer.

To achieve these and other advantages and in accordance with the purpose of the disclosure, as embodied and broadly described herein, there is provided a display apparatus including a substrate having a light emitting area, a light emitting device disposed at the light emitting area on the substrate, at least one light exiting area disposed in the light emitting area, a light blocking layer disposed at the light emitting area and overlapping the at least one light exiting area, and a light guide part disposed at the light emitting area and configured to guide light generated in the light emitting device to the at least one light exiting area.

To achieve these and other advantages and in accordance with the purpose of the disclosure, as embodied and broadly described herein, there is also provided a display apparatus including a first light emitting area and a second light emitting area where a light emitting device is disposed, a light blocking layer disposed at each of the first and second light emitting areas and having at least one opening, and a light guide part configured to guide light generated in the light emitting device so as to exit through the at least one opening.

Specific details of other examples are included in the detailed description and drawings.

DETAILED DESCRIPTION OF THE DISCLOSURE

Figure 1:
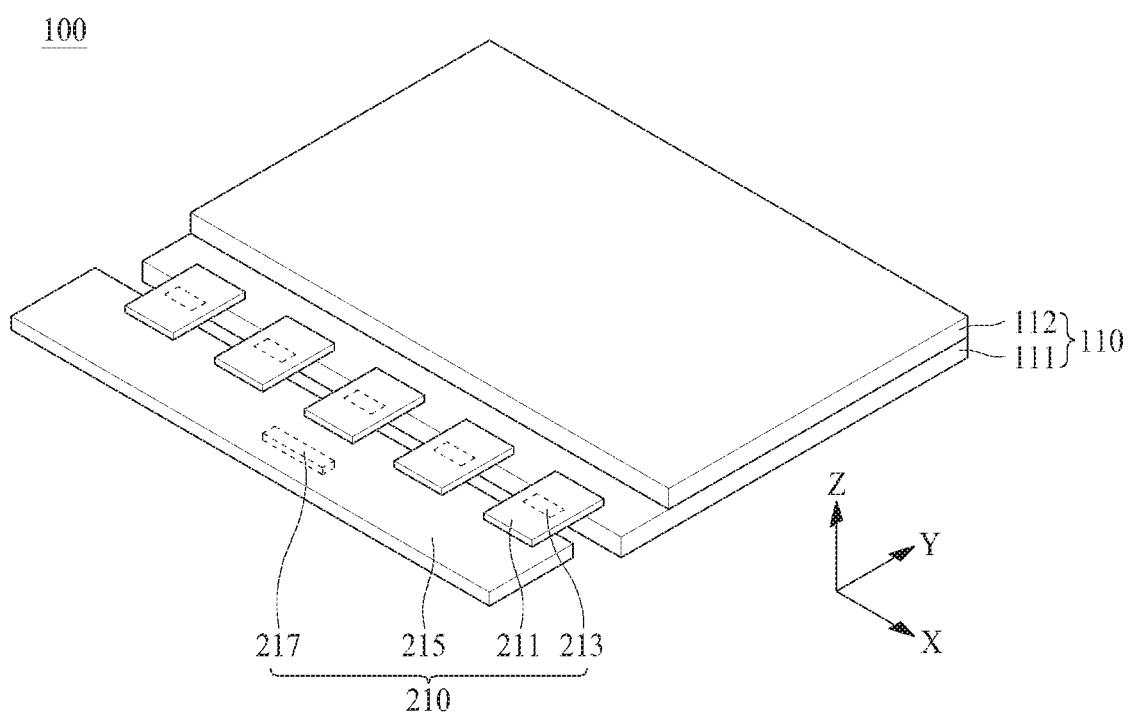
FIG. 1 is a perspective view showing a display apparatus according to an embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but can be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

In describing a position relationship, for example, when two portions are described as "-on", "-above", "-below", or "-on the side", one or more other portions can be positioned between the two portions unless "immediately" or "directly" is used.

It will be understood that, although the terms "first", "second", etc. Can be used herein to describe various elements, these elements should not be limited by these terms. These terms are only used to distinguish one element from another. For example, a first element could be termed a second element, and, similarly, a second element could be termed a first element, without departing from the scope of the present invention.

In describing elements of the present disclosure, the terms "first". "second", etc. Can be used. The terms are merely for differentiating one element from another element, and the essence, sequence, order, or number of a corresponding element should not be limited by the terms. It will be understood that when an element or layer is described as being "connected", "coupled", or "adhered" to another element or layer, the element or layer can be directly connected or adhered to the other element or layer, but the other element or layer can be "disposed" between elements or layers, or elements or layers can be "connected", "coupled", or "adhered" to each other through the other element or layer.

Therefore, in the present disclosure, examples of the display apparatus can include a display apparatus itself, such as a liquid crystal module (LCM) or an organic light emitting display (OLED) module, and a set device which is a final consumer device or an application product including the LCM or the OLED module.

Moreover, if the display panel is an organic light emitting display panel, the display panel can include a plurality of gate lines, a plurality of data lines, and a plurality of pixels respectively provided in a plurality of pixel areas defined by intersections of the gate lines and the data lines. Also, the display panel can include an array substrate including a thin-film transistor, or TFT, which is an element for selectively applying a voltage to each of the pixels, an organic light emitting device layer on the array substrate, and an encapsulation substrate disposed on the array substrate to cover the organic light emitting device layer. The encapsulation substrate can protect the TFT and the organic light emitting device layer from an external impact and can prevent water or oxygen from penetrating into the organic light emitting device layer. Also, a layer provided on the array substrate can include an inorganic light emitting layer (for example, a nano-sized material layer, such as a quantum dot layer, or the like).

Moreover, the display panel can further include a backing such as a metal plate attached to the display panel. However, the present embodiment is not limited to the metal plate, and the display panel can include another structure.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

Hereinafter, an embodiment of the present disclosure will be described with reference to the accompanying drawings and examples.

Figure 2:
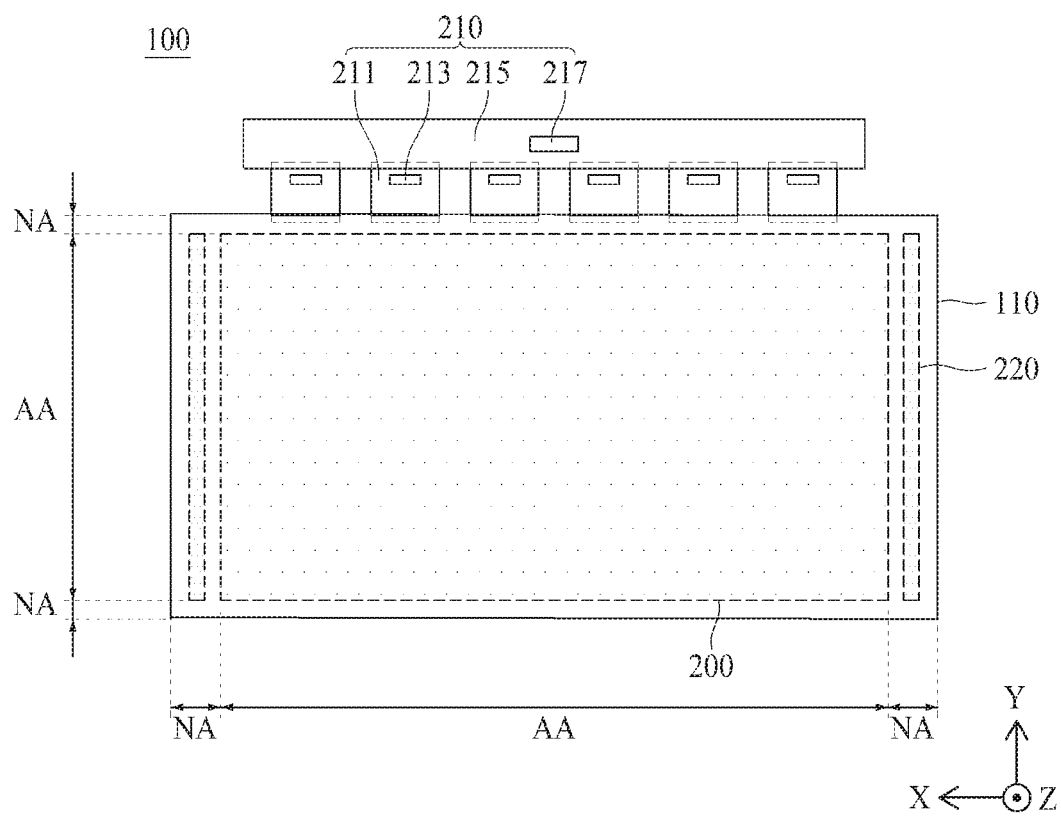
FIG. 2 is a plan view showing the display apparatus of FIG. 1 according to an embodiment of the present disclosure.

FIG. 1 is a perspective view showing a display apparatus according to an embodiment of the present disclosure and FIG. 2 is a plan view showing the display apparatus of FIG. 1 according to an embodiment of the present disclosure.

Referring to FIGS. 1 and 2, a display apparatus 100 includes a display panel 110, a first substrate 111, a pixel array layer 200, a display driving circuit unit 210, and a scan driving circuit unit 220.

The display panel 110 can include the first substrate 111 and a second substrate 112. The second substrate 112 can be an encapsulation substrate.

The first substrate 111 can be formed of glass or plastic but is not necessarily limited thereto and can be formed of a semiconductor material such as a silicon wafer. The first substrate 111 can be formed of a transparent material or an opaque material.

The display apparatus 100 according to an embodiment of the present disclosure can be formed as a top emission type in which light is emitted upward but is not limited thereto. When the display apparatus 100 according to an embodiment of the present disclosure is formed as the top emission type in which light is emitted upward, the first substrate 111 can be formed of an opaque material as well as a transparent material. Meanwhile, when the display apparatus 100 according to an embodiment of the present disclosure is formed in a so-called bottom emission type in which light is emitted downward, a transparent material can be used for the first substrate 111.

The first substrate 111, as a base substrate, can be a flexible substrate. For example, the first substrate 111 can include a transparent polyimide material. Considering that a high temperature deposition process is performed on the first substrate 111 formed of polyimide, polyimide excellent in heat resistance that can withstand high temperatures can be used. The polyimide first substrate 111 can be formed by curing a polyimide resin coated a certain thickness on an upper surface of a sacrificial layer provided on a carrier glass substrate. Here, the carrier glass substrate can be separated from the first substrate 111 by release of the sacrificial layer based on a laser-releasing process. The sacrificial layer can be formed of amorphous silicon (a-Si) or silicon nitride (SiNx).

According to an example, the first substrate 111 can be a glass substrate. For example, the first substrate 111 can include silicon oxide ($SiO_2$) or aluminum oxide ($Al_2O_3$) as a main component.

The first substrate 111 can include a display area AA and a non-display area NA. The display area AA, in which an image is displayed, can be defined at a central portion of the first substrate 111. Here, the display area AA can correspond to an active area of the pixel array layer 200. For example, the display area AA can include a plurality of pixels respectively provided at pixel areas where a plurality of gate lines and a plurality of data lines intersect each other. Here, each of the plurality of subpixels can be defined as a minimum unit area for emitting light.

The non-display area NA, which is an area in which no image is displayed, can be defined at an edge portion of the first substrate 111 surrounding the display area AA. According to an example, the non-display area NA can include a pad region having at least one pad electrode.

The pixel array layer 200 includes a thin film transistor (TFT) layer and a light emitting device layer. The TFT layer can include one or more TFTs, a gate insulating layer, an interlayer insulating layer, a passivation layer, and a planarization layer. The light emitting device layer can include a plurality of light emitting devices and a plurality of banks. A specific configuration of the pixel array layer 200 will be described later in detail with reference to FIG. 2.

The display driving circuit unit 210 can be connected to a pad electrode provided in the non-display area NA of the first substrate 111 to display an image corresponding to image data supplied from a display driving system on each pixel. According to an embodiment, the display driving circuit unit 210 can include a plurality of circuit films 211, a plurality of data driving integrated circuits (ICs) 213, a printed circuit board (PCB) 215, and a timing controller 217.

Input terminals provided on one side of each of the plurality of circuit films 211 can be adhered to the PCB 215 by a film adhering process and output terminals provided on the other side of each of the plurality of circuit films 211 can be adhered to the pad portion by the film adhering process. According to an example, each of the plurality of circuit films 211 can be implemented and bent as a flexible circuit film to reduce a bezel area of the display apparatus 100. For example, the plurality of circuit films 211 can be formed of tape carrier package (TCP) or chip on flexible board or chip on film (COF).

Each of the plurality of data driving ICs 213 can be individually mounted on each of the plurality of circuit films 211. Each of the plurality of data driving ICs 213 can receive pixel data and a data control signal provided from the timing controller 217, convert the pixel data into an analog data signal for each pixel according to the data control signal, and supply the converted data signal to a corresponding data line.

The PCB 215 can support the timing controller 217 and transfer signals and power between the components of the display driving circuit unit 210. The PCB 215 can provide a plurality of data driving ICs 213 and a scan driving circuit unit 220 with signals and driving power supplied from the timing controller 217 to display an image on each pixel. To this end, signal transmission line and various power lines can be provided on the PCB 215. For example, one or more PCBs 215 can be provided depending on the number of the circuit films 211.

The timing controller 217 can be mounted on the PCB 215 and receive image data and a timing synchronization signal provided from the display driving system through a user connector provided on the PCB 215. The timing controller 217 can generate pixel data by aligning the image data to fit to a pixel arrangement structure on the basis of the timing synchronization signal, and provide the generated pixel data to the corresponding data driving IC 213. The timing controller 217 can generate a data control signal and a scan control signal on the basis of the timing synchronization signal, control a driving timing of each of the plurality of data driving ICs 213 through the data control signal, and control a driving timing of the scan driving circuit unit 220 through the scan control signal. Here, the scan control signal can be supplied to the corresponding scan driving circuit unit 220 through a first and/or a last flexible circuit film among the plurality of circuit films 211 and the non-display area NA of the first substrate 111.

Figure 3:
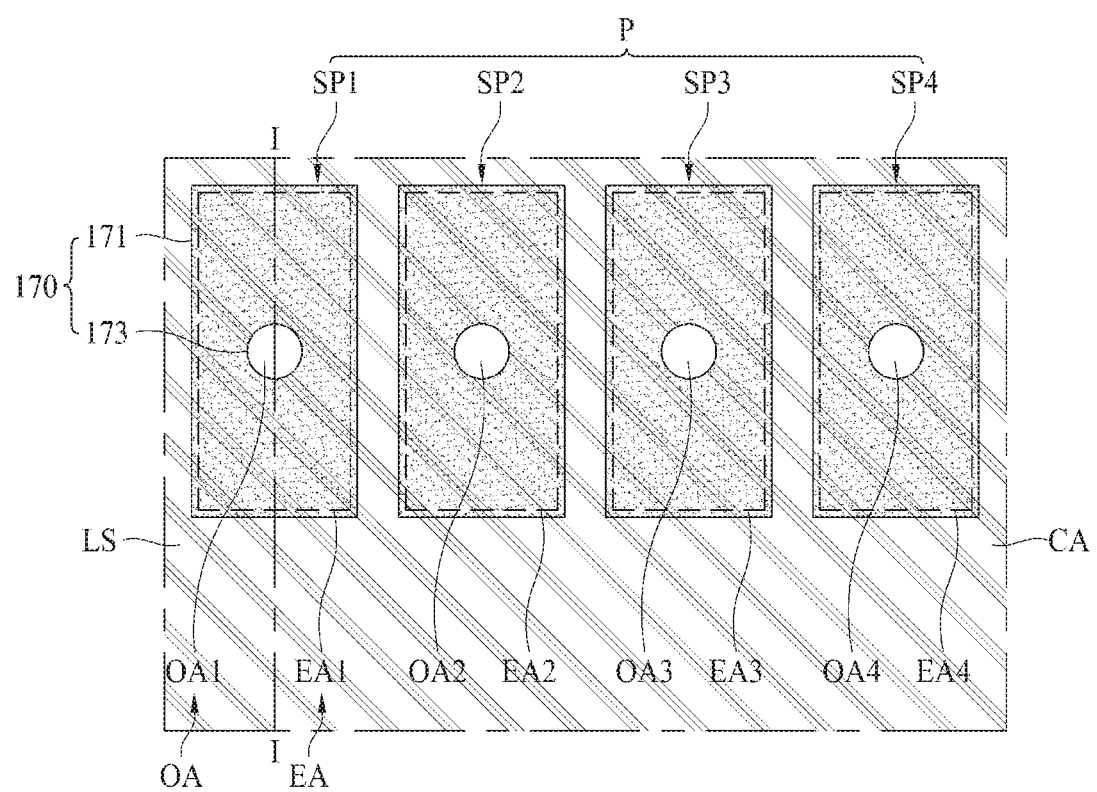
FIG. 3 shows an example of a plan view of a pixel of FIG. 2.
Figure 4:
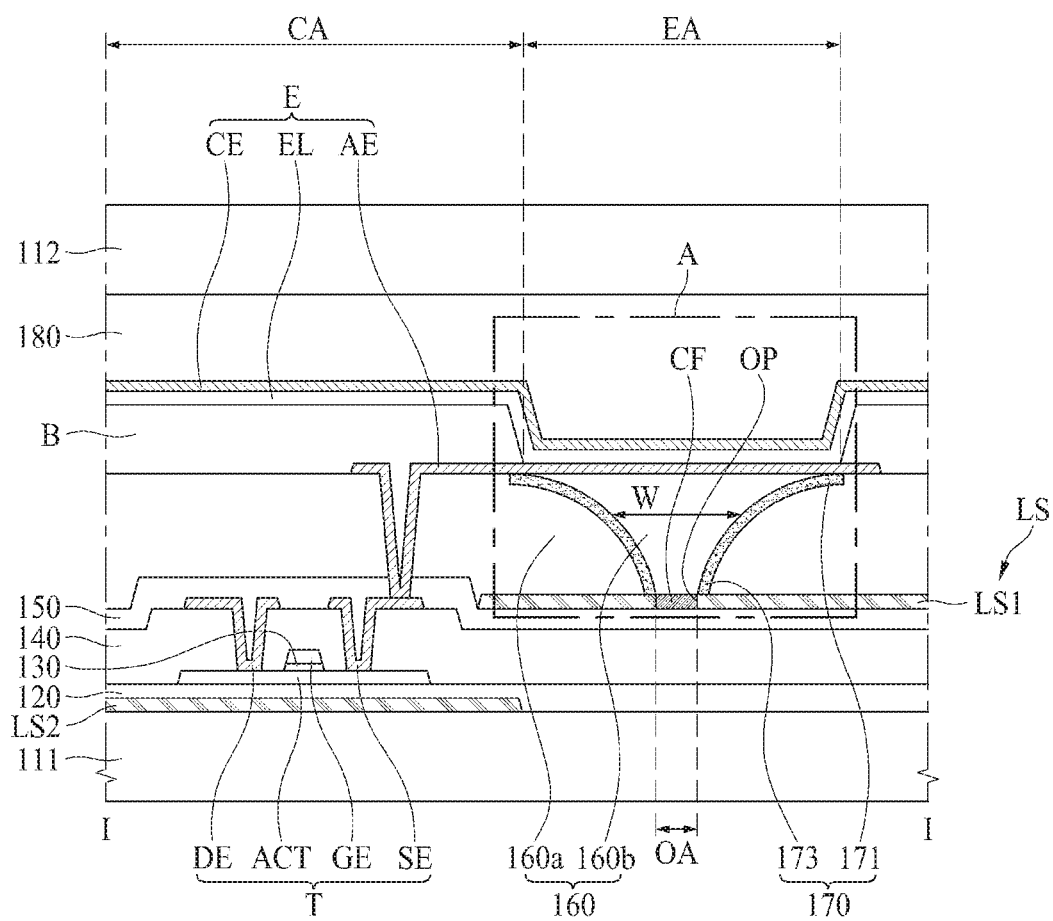
FIG. 4 shows a first example of a cross-sectional view of FIG. 3 taken along line I-I.
Figure 5:
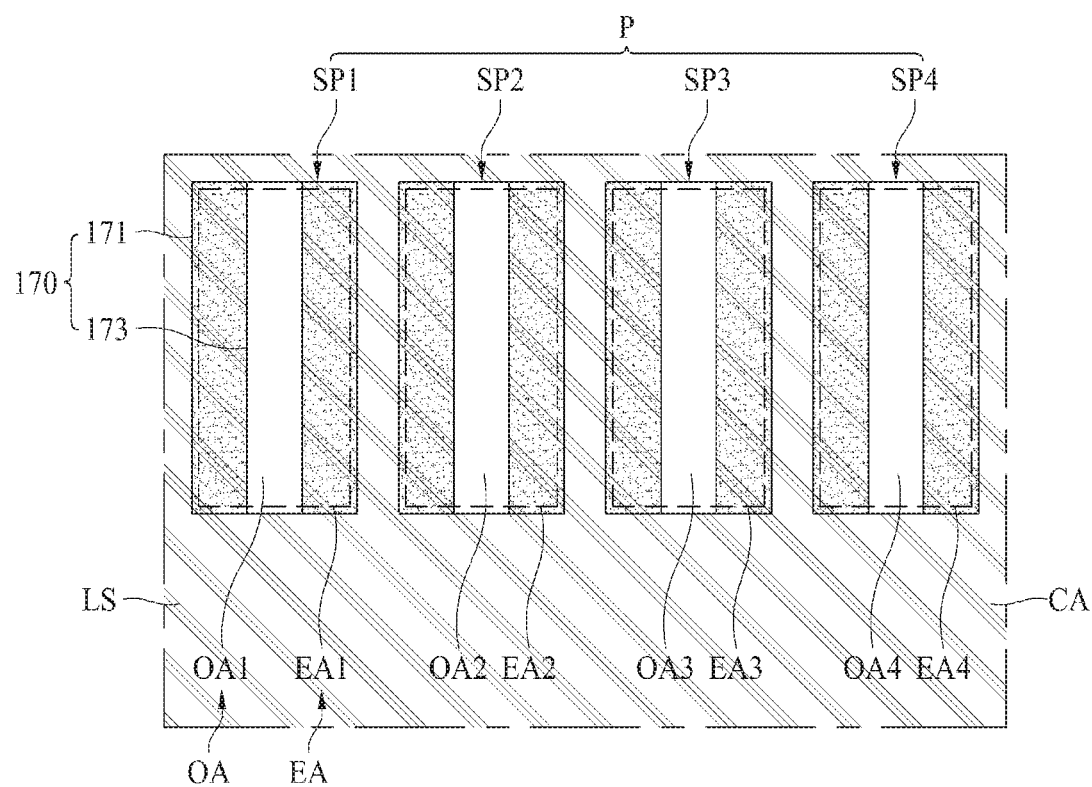
FIG. 5 shows a modification of FIG. 3.
Figure 6:
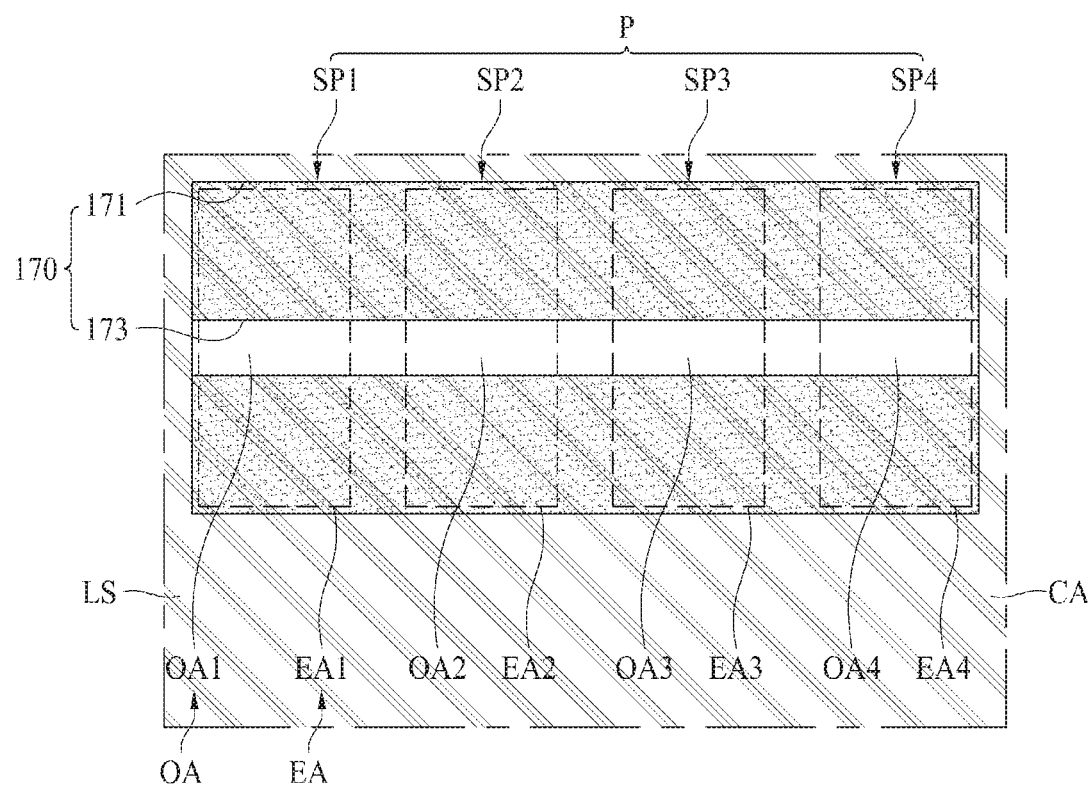
FIG. 6 shows another modification of FIG. 3.

The scan driving circuit unit 220 can be provided in the non-display area NA of the first substrate 111. The scan driving circuit unit 220 can generate a scan signal according to the scan control signal provided from the display driving circuit unit 210, and supply the scan signal to the scan line corresponding to set order. According to an example, the scan driving circuit unit 220 can be provided in the non-display area NA of the first substrate 111 together with the TFT FIG. 3 is an example of a plan view of the pixel of FIG. 2, and FIG. 4 is a first example of a cross-sectional view taken along line I-I of FIG. 3. FIG. 5 is a modification of FIG. 3 and FIG. 6 is another modification of FIG. 3. The display panel 110 of FIG. 2 includes a plurality of pixels, each of which can have the pixel configuration as shown in FIG. 3.

Referring to FIG. 3, pixels P having a circuit area CA and a light emitting area EA can be provided in a display area AA of the display apparatus 100. Each of the pixels P can include a first subpixel SP1, a second subpixel SP2, a third subpixel SP3, and a fourth subpixel SP4. The first subpixel SP1 is a red subpixel emitting red light, the second subpixel SP2 is a green subpixel emitting green light, the third subpixel SP3 is a blue subpixel emitting blue light, and the fourth subpixel SP4 can be a white subpixel emitting white light, but is not limited thereto. The arrangement order of the subpixels SP1, SP2, SP3, and SP4 can be variously changed.

Each of the subpixels SP1, SP2, SP3, and SP4 can include a light emitting area EA and a light exiting area OA. The light emitting area EA corresponds to an area where the light emitting device E generates light, and the light exiting area OA corresponds to an area for exiting light exited from the light emitting device E to the outside.

Specifically, the first subpixel SP1 can include a first light emitting area EA1 and a first light exiting area OA1 disposed in the first light emitting area EA1. The second subpixel SP2 can include a second light emitting area EA2 and a second light exiting area OA2 disposed in the second light emitting area EA2. The third subpixel SP3 can include a third light emitting area EA3 and a third light exiting area OA3 disposed in the third light emitting area EA3. The fourth subpixel SP4 can include a fourth light emitting area EA4 and a fourth light exiting area OA4 disposed in the fourth light emitting area EA4.

Referring to FIG. 4, the display apparatus 100 can be realized as a bottom emission type, but is not limited thereto, and can also be realized as a top emission type. Details thereof will be described later.

The display apparatus 100 includes a first substrate 111, a second substrate 112, a buffer layer 120, a thin film transistor T, a gate insulating layer 130, an interlayer insulating layer 140, a passivation layer 150, a planarization layer 160, a light emitting device E, a bank B, a light blocking layer LS, a light guide part 170, and a color filter CF. The display apparatus 100 can further include an encapsulation layer 180.

The first substrate 111, as a base substrate, can be a transparent flexible substrate which can be bent or curved. According to an example, the first substrate 111 can include a transparent polyimide material, but is not limited thereto. The first substrate 111 can be formed of a transparent plastic material such as polyethylene terephthalate. According to another example, the first substrate 111 can be a glass substrate. For example, the first substrate 111 can include silicon dioxide (SiO2) or aluminum oxide ($Al_2O_3$) as a main component.

The display area AA of the first substrate 111 can include a circuit area CA and a light emitting area EA. The circuit area CA of the first substrate 111 can include a pixel circuit for driving the light emitting device E and the pixel circuit can include at least one thin film transistor T. For example, the pixel circuit can include a driving transistor and at least one switching transistor.

The light emitting area EA of the first substrate 111 can include the light emitting device E that generates light by a pixel circuit. According to an example, the light emitting area EA can correspond to an opening of each of the plurality of subpixels defined by the bank B.

The buffer layer 120 can be disposed on the first substrate 111. According to an example, the buffer layer 120 can be formed by stacking a plurality of inorganic layers. For example, the buffer layer 120 can be formed of multiple layers including one or more inorganic layers of a silicon oxide film (SiOx), a silicon nitride film (SiNx), and a silicon oxynitride film (SiON) which are stacked. The buffer layer can be provided on the entire upper surface of the first substrate 111 to block moisture penetrating through the light emitting device E through the first substrate 111. Therefore, the buffer layer 120 includes a plurality of inorganic layers, thereby improving a water vapor transmission rate (WVTR) of the panel.

The thin film transistor T can be disposed on the buffer layer 120 in the circuit area CA. According to an example, the thin film transistor T can include an active layer ACT, a gate electrode GE, a drain electrode DE, and a source electrode SE.

The active layer ACT can be provided in the circuit area CA of the first substrate 111. The active layer ACT can be disposed on the buffer layer 120 and overlap a gate electrode GE, a source electrode SE, and a drain electrode DE. The active layer ACT can be in direct contact with the source electrode SE and the drain electrode DE and face the gate electrode GE with the gate insulating layer 130 interposed therebetween.

The gate insulating layer 130 can be provided on the active layer ACT. According to an example, the gate insulating layer 130 can isolate the active layer ACT from the gate electrode GE. Specifically, the gate insulating layer 130 can be provided over the entire surface of the display area AA of the first substrate 111 and can be removed except a region where the gate electrode GE is to be disposed. For example, the gate insulating layer 130 can be formed of an inorganic insulating material, for example, silicon dioxide ($SiO_2$), silicon nitride (SiNx), and silicon oxynitride (SiON), or a multi-layer thereof but is not limited thereto.

The gate electrode GE can be provided on the gate insulating layer 130. The gate electrode GE can overlap the active layer ACT with the gate insulating layer 130 interposed therebetween.

The interlayer insulating layer 140 can be provided on the gate electrode GE. The interlayer insulating layer 140 can be provided over the gate insulating layer 130 and the buffer layer 120. The interlayer insulating layer 140 can function to protect the thin film transistor T and can insulate the drain electrode DE or the source electrode SE from the gate electrode GE. A corresponding region of the interlayer insulating layer 140 can be removed in order to allow the active layer ACT to be in contact with the source electrode SE or the drain electrode DE. For example, the interlayer insulating layer 140 can include a contact hole through which the source electrode SE penetrates and a contact hole through which the drain electrode DE penetrates.

The drain electrode DE and the source electrode SE can be provided on the interlayer insulating layer 140 and spaced apart from each other. The drain electrode DE is in contact with one end of the active layer ACT through a contact hole provided in the interlayer insulating layer 140 and the source electrode SE can be in contact with the other end of the active layer ACT through the contact hole provided in the interlayer insulating layer 140. The source electrode SE can be in direct contact with the anode electrode AE through a contact hole of the passivation layer 150 and a contact hole of the planarization layer 160.

The passivation layer 150 can be provided on the interlayer insulating layer 140, the source electrode SE, and the drain electrode DE. The passivation layer 150 can function to protect the source electrode SE and the drain electrode DE. The passivation layer 150 can include a contact hole through the anode electrode AE penetrates. Here, the contact hole of the passivation layer 150 can be connected to the contact hole of the planarization layer 160 to allow the anode electrode AE to penetrate therethrough.

The planarization layer 160 can be disposed over the first substrate 111 and can overlay the thin film transistor T disposed in the circuit area CA. Specifically, the planarization layer 160 can be provided on the passivation layer 150 to planarize the top of the thin film transistor T. The planarization layer 160 can include a contact hole through which the anode electrode AE penetrates. Here, the contact hole of the planarization layer 160 can be connected to the contact hole of the passivation layer 150 to allow the anode electrode AE to penetrate therethrough.

The light emitting device E can be disposed on the planarization layer 160 in the light emitting area EA and can be electrically connected to the thin film transistor T. The light emitting device E can include an anode electrode AE, a light emitting layer EL, and a cathode electrode CE.

The anode electrode AE can be disposed on the planarization layer 160 and can be electrically connected to the source electrode SE of the thin film transistor T through the contact hole provided in the planarization layer 160. The anode electrode AE can be disposed in the light emitting area EA. Here, the light emitting area EA can correspond to an opening of each of a plurality of subpixels defined by the bank B. Specifically, a portion of the anode electrode AE can be covered by the bank B, and the other portion of the anode electrode AE may not be covered by the bank B and can be exposed. In the light emitting area EA, the anode electrode AE may not be covered by the bank B and can correspond to the exposed area. The anode electrode AE can be surrounded by the bank B defining the opening of each of the plurality of subpixels.

When the display apparatus 100 is a bottom emission type, the anode electrode AE can be formed of a transparent conductive material (TCO), such as ITO or IZO allowing light to be transmitted therethrough or a semi-transmissive conductive material such as magnesium (Mg), silver (Ag), or an alloy of magnesium (Mg) and silver (Ag).

The light emitting layer EL can be provided on the anode electrode AE. For example, the light emitting layer EL can include a hole transporting layer, an organic light emitting layer, and an electron transporting layer. According to an example, the light emitting layer EL can further include at least one functional layer for improving luminous efficiency, lifetime, and the like of the light emitting layer.

The light emitting layer EL can be formed to be common to all the pixels, without being divided by pixel areas but is not limited thereto. In the light emitting layer EL, organic light emitting layers emitting light of different colors can be patterned in each pixel area. For example, a red light emitting layer can be patterned at a red subpixel, a green light emitting layer can be patterned at a green subpixel, and a blue light emitting layer can be patterned at a blue subpixel, but is not limited thereto.

The cathode electrode CE can be provided on the light emitting layer EL. The cathode electrode CE can be realized in the form of an electrode common to all the subpixels, without being divided by pixel areas. When the display apparatus 100 is a light emission type, the cathode electrode CE can be formed of a metal having high reflectivity such as aluminum (Al), silver (Ag), or an Ag alloy.

The bank B can be disposed on the planarization layer 160 in the circuit area CA. According to an example, the bank B can be disposed between the light emitting areas EA of each of the plurality of subpixels, thereby defining the light emitting area EA of each of the plurality of pixels. For example, the bank B can cover a portion of the anode electrode AE. An area of the anode electrode AE not covered by the bank B can be defined as the light emitting area EA.

The light blocking layer LS can be disposed between the light emitting device E and the first substrate 111 in the display area AA. The light blocking layer LS is disposed in the remaining area except at least one light exiting area OA of the display area AA to block light. The light blocking layer LS can include a first light blocking layer LS1 disposed in the light emitting area EA and a second light blocking layer LS2 disposed in the circuit area CA.

The first light blocking layer LS1 can be disposed between the light emitting device E and the first substrate 111. The first light blocking layer LS1 can be disposed in the light emitting area EA and can have at least one opening OP. Here, at least one opening OP of the first light blocking layer LS1 can correspond to at least one light exiting area OA. Specifically, the light emitting area EA corresponds to an area where the light emitting device E generates light, and the light exiting area OA corresponds to an area where light emitted from the light emitting device E is exited to the outside. The first light blocking layer LS1 can include the opening OP to form at least one light exiting area OA in the light emitting area EA. As a result, the first light blocking layer LS1 can be disposed in the remaining light emitting area EA except for the at least one light exiting area OA.

The first light blocking layer LS1 can be patterned on the passivation layer 150 but the present disclosure is not limited thereto. For example, when the display apparatus 100 according to the present disclosure is configured by omitting the passivation layer 150, the first light blocking layer LS1 can be disposed between the interlayer insulating layer 140 and the planarization layer 160.

According to an example, the first light blocking layer LS1 can include a light blocking material or a light absorbing material. The first light blocking layer LS1 can overlap the light guide part 170 to prevent external light from being reflected by the light guide part 170. Specifically, the light guide part 170 can be formed of a material that reflects light, and can guide the light emitted from the light emitting device E to the light exiting area OA. Accordingly, the first light blocking layer LS1 covers the light guide part 170 with respect to the light exiting direction, thereby blocking light incident on the light guide part 170 to prevent external light from being reflected to the light guide part 170. Accordingly, the first light blocking layer LS1 can reduce reflectance of external light of the display apparatus 100, thereby improving the reflection visibility, reducing power consumption, and improving luminance. Also, the first light blocking layer LS1 can prevent light emitted from each of the plurality of light emitting devices E from being mixed with each other, thereby improving light leakage and visibility degradation.

According to an example, the area of the light exiting area OA can be smaller than the area of the light emitting area EA. Specifically, a portion of the light emitting area EA can overlap the first light blocking layer LS1 and the other portion of the light emitting area EA can overlap the opening OP of the first light blocking layer LS1. The opening OP of the first light blocking layer LS1 can correspond to the light exiting area OA. Therefore, the area of the light exiting area OA can be smaller than the area of the light emitting area EA, and external light reflectance of the display apparatus 100 can be determined according to an area ratio of the light exiting area OA to the light emitting area EA.

According to an example, as the area ratio of the light exiting area OA to the light emitting area EA is reduced, the external light reflectance of the display apparatus 100 can be reduced. Specifically, the light emitting device E can generate light and simultaneously reflect external light. For example, as the exposed area of the light emitting device E with respect to the light exiting direction is increased, light emitting efficiency can simultaneously be improved but the external light reflectance can also be increased at the same time and reflection visibility can be deteriorated. Accordingly, in the display apparatus 100 according to the present disclosure, by covering the light emitting area EA excluding the light exiting area OA with the first light blocking layer LS1, the exposed area of the light emitting device E with respect to the light exiting direction can be minimized and external light reflectance can be reduced to improve reflection visibility. In addition, in the display apparatus according to the present disclosure, since an external light reflectance is reduced through the first light blocking layer LS1, a separate polarization layer or a polarization conversion layer may not be provided and high manufacturing cost problem can be solved. In addition, since the display apparatus 100 according to the present disclosure includes the light guide part 170, a reduction in luminous efficiency due to a reduction in the area ratio of the light exiting area OA to the light emitting area EA can be prevented. Details of the light guide part 170 will be described later.

The second light blocking layer LS2 can be disposed over the first substrate 111 and overlap the thin film transistor T. The second light blocking layer LS can be disposed in the circuit area CA where the thin film transistor T is disposed. The second light blocking layer LS2 can be disposed over an upper surface of the first substrate 111. For example, the second light blocking layer LS2 can be formed by depositing a metal on the first substrate 111 and subsequently performing exposure patterning.

According to an example, the display apparatus 100 can be disposed at the light emitting area EA excluding the light exiting area OA through the first light blocking layer LS1 and disposed at the circuit area CA through the second light blocking layer LS2. Therefore, as the display apparatus 100 according to the present disclosure is entirely disposed at the other remaining display area AA excluding the light exiting area OA through the first and second light blocking layers LS1 and LS2, external light reflectance can be minimized and reflection visibility can be improved.

The light guide part 170 can guide light emitted from the light emitting device E to at least one light exiting area OA. Specifically, the light guide part 170 can be disposed on the same layer as the planarization layer 160. The light guide part 170 can be inserted into the planarization layer 160 and overlap the other remaining region except the light exiting area OA of the light emitting area EA. For example, a portion 160a of the planarization layer 160 is provided in the circuit area CA and is also provided on the first light blocking layer LS1 to provide a space in which the light guide part 170 is to be inserted in the light emitting area EA. That is, the portion 160a of the planarization layer 160 provided on the first light blocking layer LS1 can serve as a frame for the light guide part 170 to be disposed. When the light guide part 170 is disposed over the portion 160a of the planarization layer 160, the other portion 160b of the planarization layer 160 can cover the light guide part 170 to planarize an upper surface of the planarization layer. That is, the portion 160a of the planarization layer 160 formed first in the circuit area CA and the other portion 160b of the planarization layer 160 formed later in the light emitting area EA can provide the planarized upper surface.

The light guide part 170 can include a light entering portion 171 on which light generated in the light emitting device E is incident and a light exiting portion 173 from which the incident light is exited.

A distance from the light guide part 170 to the light emitting device E can be increased from the light entering portion 171 to the light exiting portion 173. That is, in the light guide part 170, the light entering portion 171 can be disposed closer to the light emitting device E than the light exiting portion 173. When the display apparatus 100 is a bottom emission type, the light guide part 170 can be disposed such that the light entering portion 171 faces the second substrate 112 and the light exiting portion 173 faces the first substrate 111, whereby light generated in the light emitting device E can be emitted to the outside through the first substrate 111.

According to an example, the light entering portion 171 of the light guide part 170 can be in direct contact with the light emitting device E to allow light generated from the light emitting device E to enter therethrough. That is, light emitted from the light emitting device E can be incident on the light guide part 170 through the light entering portion 171. Light incident on the light guide part 170 can exit to the outside of the light guide part 170 through the light exiting portion 173.

According to an example, a shape of the light entering portion 171 of the light guide part 170 can be determined according to a shape of the light emitting area EA. The light entering portion 171 of the light guide part 170 can overlap the light emitting area EA and can be larger than the light emitting area EA or can have the same shape as the light emitting area EA. For example, the light entering portion can be formed to correspond to the anode electrode AE surrounded by the bank B. Therefore, the light entering portion of the light guide part 170 can cause light generated from the light emitting device E to entirely enter the light guide part 170. Thus, the light entering portion of the light guide part 170 is in direct contact with the light emitting device E, thereby preventing light generated from the light emitting device E from leaking.

The light guide part 170 can have a width W decreased from the light entering portion 171 to the light exiting portion 173. According to an example, a vertical section of the light guide part 170 can have a shape of a curve convex toward the light entering portion 171. For example, the light guide part 170 can have a funnel shape in which the width D thereof decreases and a gradient increases from the light entering portion 171 toward the light exiting portion 173. The light incident on the light entering portion 171 of the light guide part 170 can be reflected by the light guide part 170 and the cathode electrode CE so as to be guided to the light exiting portion 173. In the case where the light guide part 170 has the funnel shape, a light path can be reduced and the number of times of reflection by the light guide part 170 and the cathode electrode CE is reduced to thus enhance luminous efficiency of the display apparatus 100, as compared with a case where the light guide part 170 has a shape of a truncated cone. For example, since light reflectivity by the light guide part 170 and the cathode electrode CE is less than 100%, the display apparatus 100 according to the present disclosure reduces the number of times of reflection to improve luminous efficiency of the display apparatus 100.

According to an example, the light exiting portion 173 of the light guide part 170 can be smaller than the light entering portion 171. Specifically, the light guide part 170 can be formed of a material that reflects light. The light guide part 170 can reflect light incident through the light entering portion 171 to concentrate light on the light exiting portion 173. The light guide part 170 can concentrate light so that the amount of light exiting through the light exiting portion 173 is held at substantially the same level as the amount of light incident through the light entering portion 171.

In other words, the light guide part 170 can minimize the amount of light that is lost in the process of reflecting light incident through the light entering portion 171. For example, in a case where the area ratio of the light exiting area OA to the light emitting area EA is significantly small, luminous efficiency of the display apparatus 100 not including the light guide part 170 can be significantly reduced. Therefore, even if the area ratio of the light exiting area OA to the light emitting area EA is significantly small, the display apparatus 100 according to the present disclosure can prevent a reduction in luminous efficiency using the light guide part 170.

As a result, the display apparatus according to the present disclosure can reduce external light reflectance by the light blocking layer LS disposed in the display area AA excluding the light exiting area OA having a small area. In addition, the display apparatus according to the present disclosure can improve luminous efficiency by concentrating light generated from the light emitting device E to the light exiting area OA through the light guide part 170

According to one example, the light exiting portion 173 of the light guide part 170 can have a square or circular shape. For example, the shape of the light exiting portion 173 of the light guide part 170 can have a circular shape as shown in FIG. 3. The light exiting portion 173 of the light guide part 170 can have a shape corresponding to the light exiting area OA disposed in the light emitting area EA. That is, when the light exiting area OA has a circular shape, the shape of the light exiting portion 173 of the light guide part 170 can have a circular shape at a position corresponding to the light exiting area OA. However, the present disclosure is not necessarily limited thereto.

In another example, the shape of the light exiting portion 173 of the light guide part 170 can have a quadrangular shape as shown in FIG. 5. When the light exiting area OA has a rectangular shape (or a square shape), the shape of the light exiting portion 173 of the light guide part 170 can also have a rectangular shape (or a square shape) at a position corresponding to the light exiting area OA.

Meanwhile, each of the subpixels SP1, SP2, SP3, and SP4 can include one light guide part 170 as shown in FIGS. 3 and 5. Specifically, one light guide part 170 is disposed at the first subpixel SP1, another light guide part 170 is disposed at the second subpixel SP2, another light guide part 170 is disposed at the third subpixel SP3, and another light guide part 170 can be disposed at the fourth subpixel SP4. However, the present disclosure is not limited thereto.

One pixel P can include one light guide part 170 as shown in FIG. 6. Specifically, a single light guide part 170 can be disposed at the first, second, third, and fourth subpixels SP1, SP2, SP3, and SP4. When one light guide part 170 is provided at one pixel P as shown in FIG. 6, the light guide part 170 may not need to be provided at each subpixel SP1, SP2, SP3, or SP4, and thus, difficulty of process can be lowered.

Meanwhile, when the light guide part 170 is provided at each of the subpixels SP1, SP2, SP3, and SP4 as shown in FIGS. 3 and 5, the difficulty of process can be high but areas of the light exiting areas OA of the subpixels SP1, SP2, SP3, and SP4 can be different. The areas of the light exiting areas OA can be designed such that light of a main wavelength band is best extracted.

The color filter CF can overlap at least one light exiting area OA. At least one color filter CF can be disposed to correspond to at least one light exiting area OA. Specifically, the color filter CF can be inserted into the opening OP of the first light blocking layer LS1. That is, the color filter CF can be disposed in the light exiting area OA in the same layer as the first light blocking layer LS1. Light exiting from the light exiting portion 173 of the light guide part 170 can entirely pass through the color filter CF. The color filter CF can be arranged to correspond to at least one light exiting area OA to convert light emitted from the light emitting device E into light having a different color or can allow only a portion of light emitted from the light emitting device E to be transmitted therethrough. For example, the color filter CF can include a red color filter, a green color filter, and a blue color filter. The first subpixel SP1 can include a red color filter. The red color filter can be disposed to correspond to the light exiting area OA and can allow only red light of the light emitted from the light emitting device E to be transmitted therethrough. The second subpixel SP2 can include a green color filter. The green color filter can be disposed to correspond to the light exiting area OA and can allow only green light of the light emitted from the light emitting device E to be transmitted therethrough. The third subpixel SP3 can include a blue color filter. The blue color filter can be disposed to correspond to the light exiting area OA and can allow only blue light of the light emitted from the light emitting device E to be transmitted therethrough. The fourth subpixel SP4 can be realized without a color filter.

The encapsulation layer 180 can be formed to cover the light emitting device E. The encapsulation layer 180 can prevent oxygen or moisture from penetrating through the light emitting device E.

Figure 7A:
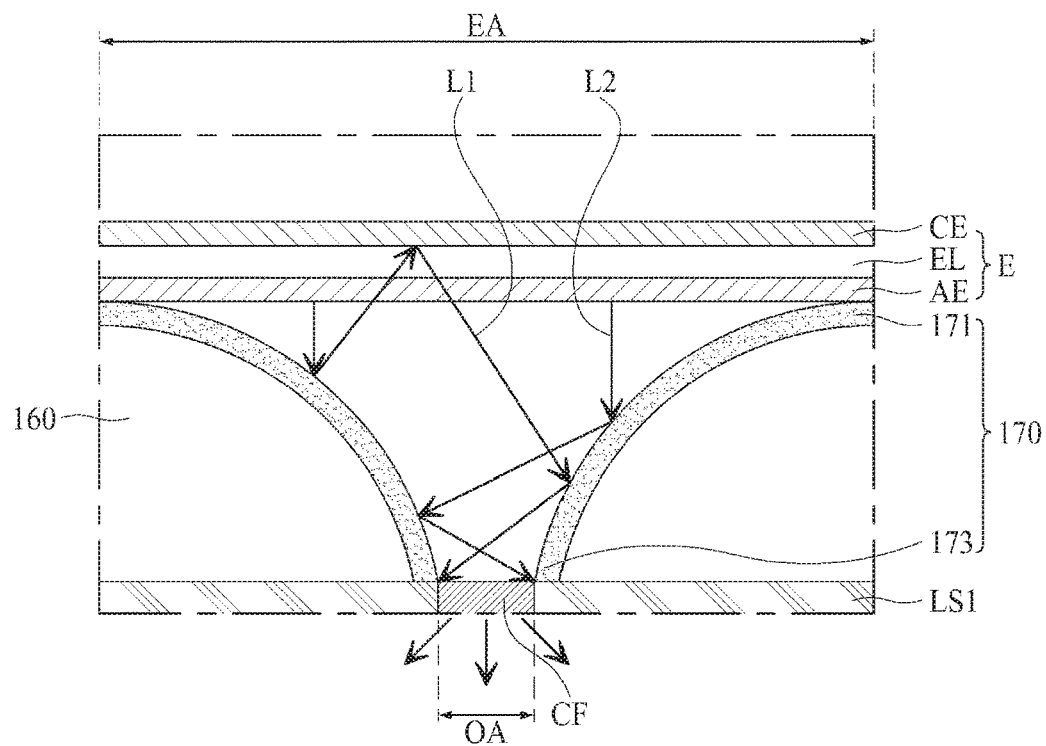
FIGS. 7A and 7B are views illustrating a path along which light is emitted and a path along which external light is reflected or absorbed in the display apparatus of FIG. 4.
Figure 7B:
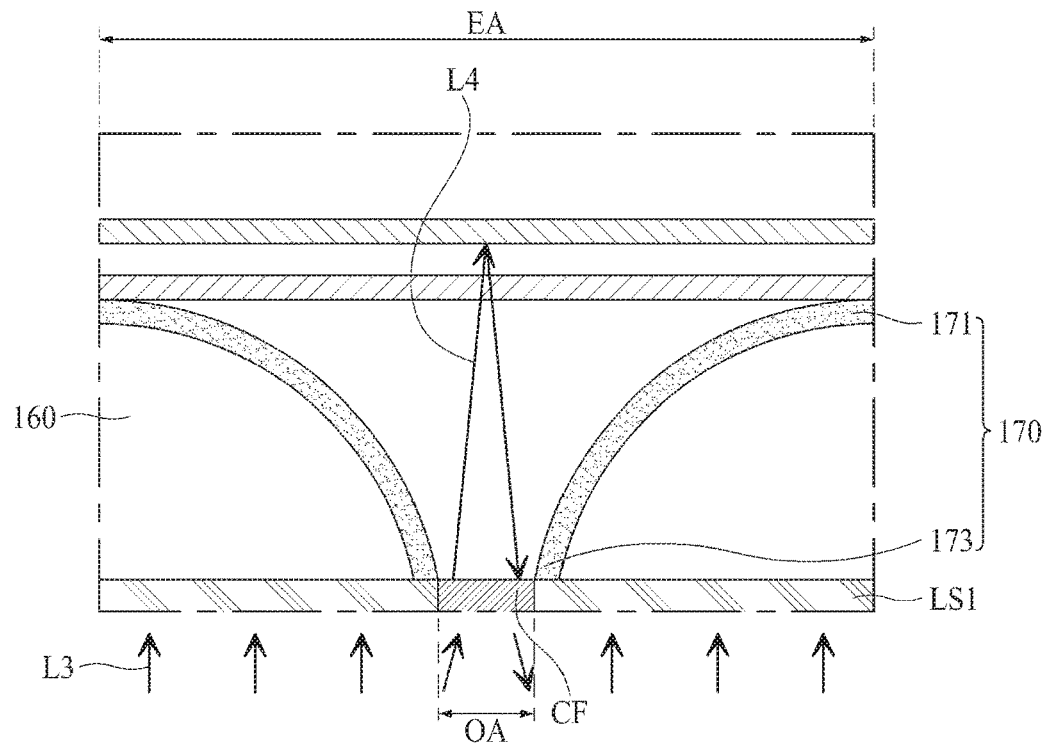

FIGS. 7A and 7B are views illustrating a path in which light is emitted and a path through which external light is reflected or absorbed in the display apparatus of FIG. 4. Specifically, FIG. 7A is a view illustrating a path in which light generated from the light emitting device E is emitted and FIG. 7B is a view illustrating a path in which external light is absorbed by the first light blocking layer LS1 or reflected by the light emitting device E.

In FIG. 7A, first and second lights L1 and L2 generated in the light emitting device E can be incident on the light entering portion 171 of the light guide part 170 and reflected by the light guide part 170 and the cathode electrode CE so as to be guided to the light exiting portion 173. In case where the display apparatus 100 is a bottom emission type, the cathode electrode CE can be formed of a metal having high reflectivity such as aluminum (Al), silver (Ag), or an Ag alloy.

For example, the first light L1 can be generated in the light emitting device E and incident on the light entering portion of the light guide part 170. A first light L1 incident on the light entering portion 171 can be reflected by one side of the light guide part 170 and travel to the light emitting device E. The first light L1 can be reflected by the cathode electrode CE of the light emitting device E and travel to the other side of the light guide part 170. The first light L1 can be reflected by the other side of the light guide part 170 and guided to the light exiting portion 173 of the light guide part 170. Lastly, the first light L1 can pass through the color filter CF connected to the light exiting portion 173 of the light guide part 170, and colored light corresponding to the color filter CF can be output.

The second light L2 can be generated in the light emitting device E and incident on the light entering portion of the light guide part 170. The second light L1 incident on the light entering portion 171 can be reflected by the other side of the light guide part 170 and travel to one side of the light guide part 170. The second light L2 can be reflected by one side of the light guide part 170 and guided to the light exiting portion 173 of the light guide part 170. Lastly, the second light L2 can pass through the color filter CF connected to the light exiting portion 173 of the light guide part 170, and colored light corresponding to the color filter CF can be output.

As described above, the light guide part 170 can concentrate the light incident through the light entering portion 171 on the light exiting portion 173. Therefore, in the display apparatus 100, even if the area ratio of the light exiting area OA to the light emitting area EA is significantly small, light can be concentrated such that the amount of light exiting to the light exiting area OA is held almost at the same level as the amount of light generated in the light emitting area EA. That is, the display apparatus 100 can minimize the amount of light that is lost in the process of reflecting the light incident through the light entering portion. As a result, by including the light guide part 170, the display apparatus 100 according to the present disclosure can prevent a reduction in luminous efficiency.

In FIG. 7B, the light incident from the outside can be absorbed by the first light blocking layer LS1 or reflected by the light emitting device E.

For example, the third light L3 can be incident from the outside and reach the first light blocking layer LS1. The third light L3 can be absorbed by the first light blocking layer LS1, so that the third light L3 may not be reflected by the first light blocking layer LS1.

The fourth light L4 can be incident from the outside and pass through the color filter CF disposed in the opening OP of the first light blocking layer LS1. The fourth light L4 passing through the color filter CF can have a color corresponding to the color filter CF and reach the light emitting device E. The fourth light L4 can be reflected by the cathode electrode CE of the light emitting device E and then exit through the color filter CF again. Here, the amount of light can be reduced as the finally exited fourth light L4 passes twice through the color filter CF.

As described above, the first light blocking layer LS1 can cover the light emitting area EA except the light exiting area OA. Therefore, the first light blocking layer LS1 can minimize an exposed area of the light emitting device E with respect to the light exiting direction and prevent the light incident from the outside from being reflected in an area excluding the light exiting area OA by the light emitting device E. Further, the first light blocking layer LS1 can prevent the light incident from the outside from being reflected by the light guide part 170. As a result, the display apparatus according to the present disclosure can reduce the area ratio of the light exiting area OA to the light emitting area EA, thereby reducing the external light reflectance and improving the reflection visibility.

Figure 8:
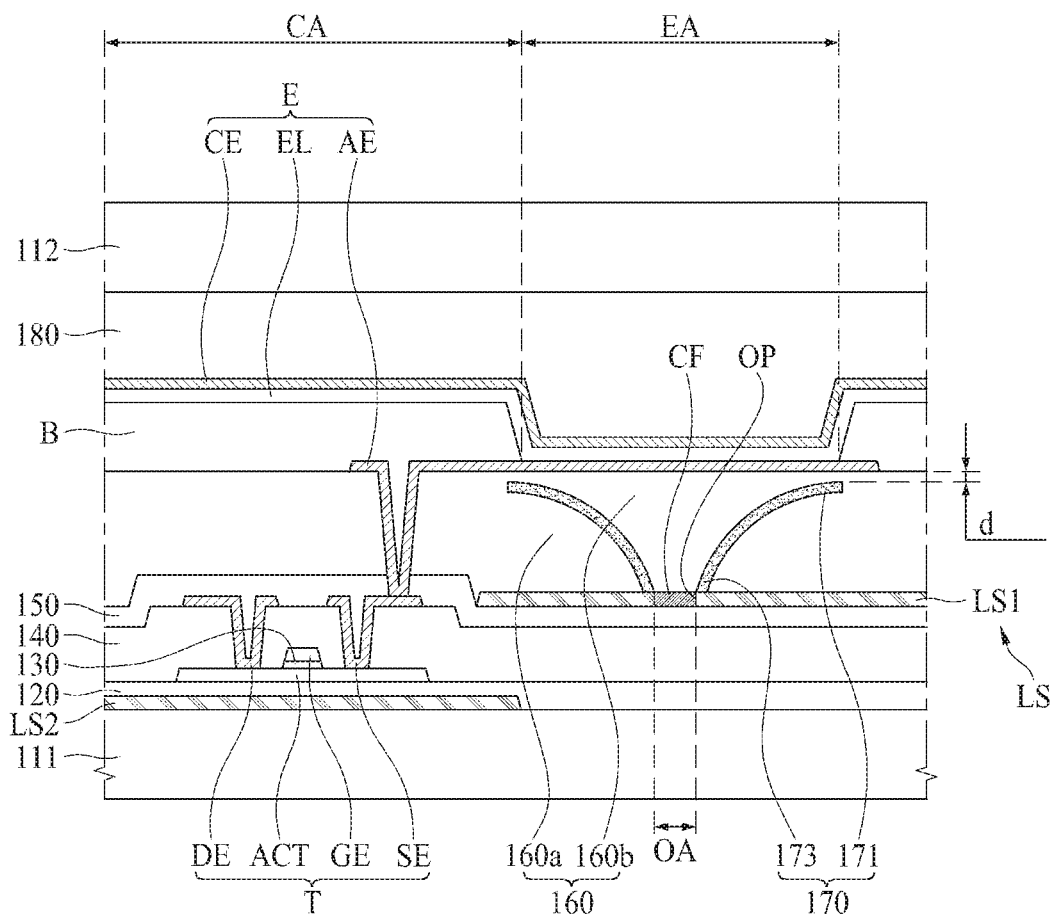
FIG. 8 shows a second example of the cross-sectional view taken along line I-I of FIG. 3.

FIG. 8 is a second example of the cross-sectional view taken along line I-I of FIG. 3.

Referring to FIG. 8, the light entering portion of the light guide part 170 can be spaced apart from the light emitting device E by a certain distance d. Specifically, the portion 160a of the planarization layer 160 is provided on the circuit area CA and is also provided on the first light blocking layer LS1 to provide a space in which the light guide part 170 is to be inserted in the light emitting area EA. That is, the portion 160a of the planarization layer 160 provided on the first light blocking layer LS1 can serve as a frame for the light guide part 170 to be disposed. Here, a height of the planarization layer 160 provided on the first light blocking layer LS1 can be lower than a height of the planarization layer 160 provided on the circuit area CA. For example, the height of the planarization layer 160 provided on the circuit area CA can correspond to the sum of the height of the planarization layer 160 provided on the first light blocking layer LS1, a thickness of the light entering portion 171 of the light guide part 170, and a distance d between the light entering portion 171 and the light emitting device E. When the light guide part 170 is disposed over the portion 160a of the planarization layer 160, the other portion 160b of the planarization layer 160 can cover the light guide part 170 to planarize an upper surface of the planarization layer. That is, the portion 160a of the planarization layer 160 formed first in the circuit area CA and the other portion 160b of the planarization layer 160 formed later in the light emitting area EA can provide the planarized upper surface.

Therefore, the light entering portion of the light guide part 170 may not be in direct contact with the light emitting device E, and thus, damage that can be caused as the light guide part 170 and the light emitting device E are in direct contact with each other can be prevented.

In addition, it is possible to minimize light lost in the light entering portion 171 of the light guide part 170. Specifically, the light guide part 170 can have a funnel shape as shown in FIG. 5. The light entering portion 171 of the light guide part 170 has a very small gradient. When there is no distance between the light guide part 170 and the light emitting device E, the number of reflections of the light incident on the light entering portion 171 having a small gradient between the light guide part 170 and the cathode electrode CE can be increased to be partially lost. Some reflections can be lost as the number of reflections increases. The display apparatus 100 according to the second embodiment of the present disclosure can reduce the number of reflections of light incident on the light entering portion 171 having a small gradient by separating the light guide part 170 from the light emitting device E.

The distance d between the light entering portion 171 of the light guide part 170 and the light emitting device E can be adjusted to make light generated from the light emitting device E enter the light guide part 170 as much as possible.

Figure 9:
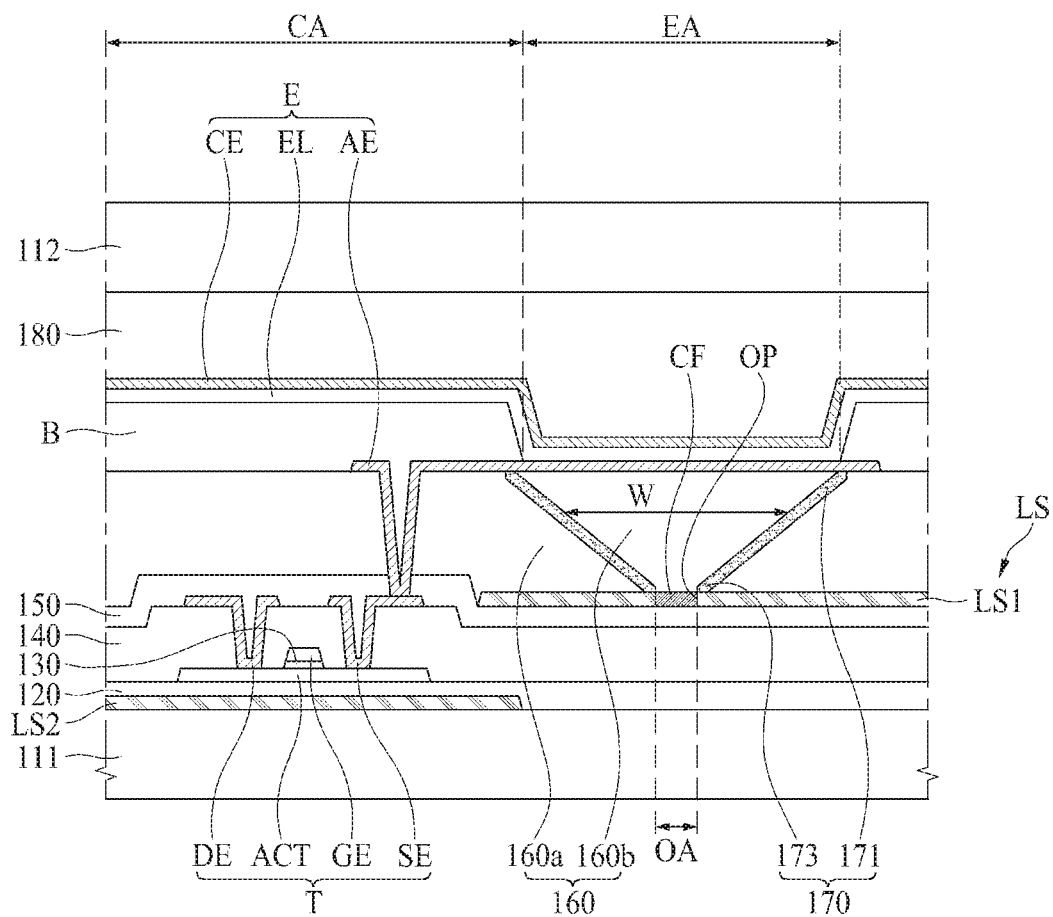
FIG. 9 shows a third example of the cross-sectional view taken along line I-I of FIG. 3.

FIG. 9 is a third example of the cross-sectional view taken along line I-I of FIG. 3.

Referring to FIG. 9, the vertical cross-section of the light guide part 170 can have a shape of an opaque line. For example, the light guide part 170 can have a width W decreased toward the light exiting portion 173 and have a shape of a truncated cone with a certain gradient. The light incident on the light entering portion 171 of the light guide part 170 can be reflected by the light guide part 170 and the cathode electrode CE so as to be guided to the light exiting portion 173. The light guide part 170 can concentrate the light so that the amount of light exiting through the light exiting portion 173 is maintained substantially at the same level as the amount of light incident through the light entering portion 171. The light guide part 170 can minimize the amount of light that is lost in the process of reflecting light incident through the light entering portion. In case where the light guide part 170 has the shape of a truncated cone, loss of light in the light entering portion 171 can be prevented due to the larger gradient at the light entering portion 171 than in the case where the light guide part 170 has a funnel shape.

Figure 10:
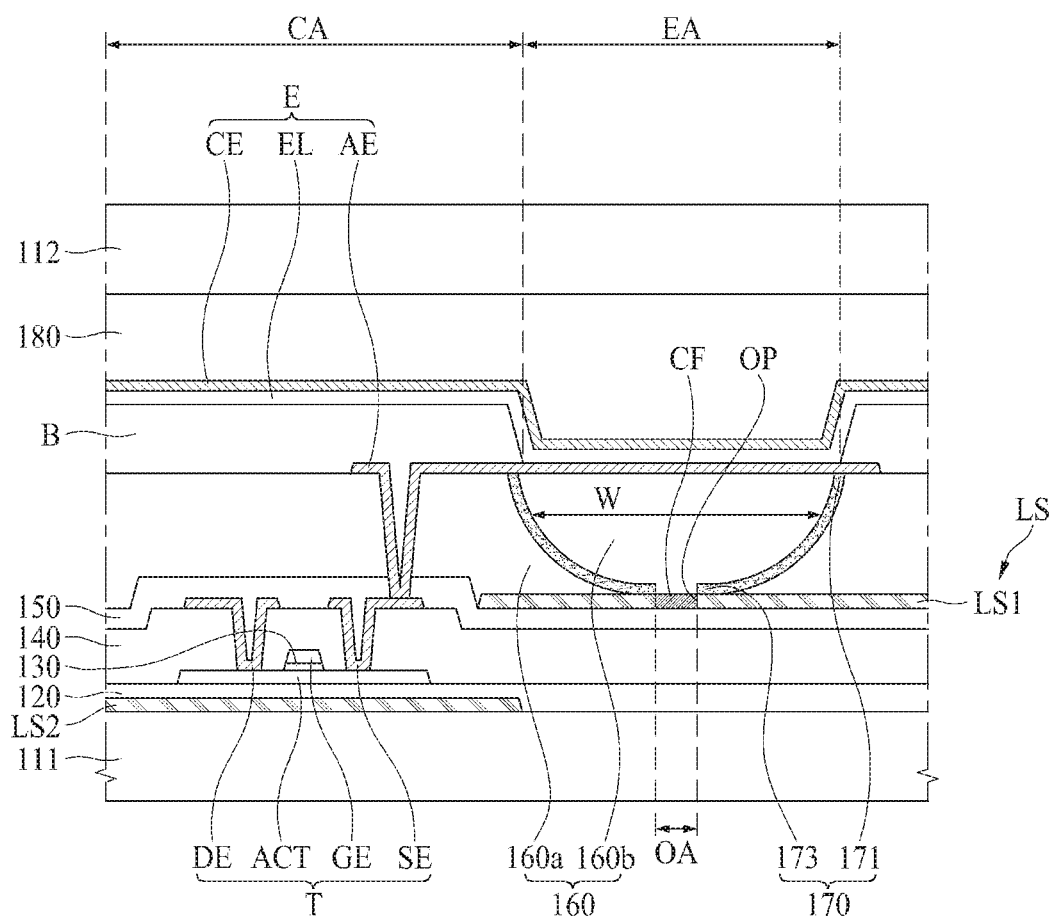
FIG. 10 shows a fourth example of the cross-sectional view taken along line I-I in FIG. 3.

FIG. 10 is a fourth example of the cross-sectional view taken along line I-I of FIG. 3.

Referring to FIG. 10, the vertical cross-section of the light guide part 170 can have a shape of a curved convexly toward the light exiting portion 173. For example, the light guide part 170 can have a hemispherical shape in which the width W is decreased from the light entering portion 171 toward the light exiting portion 173 and the gradient is decreased. Light incident on the light entering portion 171 of the light guide part 170 can be reflected by the light guide part 170 and the cathode electrode CE so as to be guided to the light exiting portion 173. The light guide part 170 can concentrate light so that the amount of light exiting through the light exiting portion 173 is held substantially at the same level as the amount of light incident through the light entering portion 171. The light guide part 170 can minimize the amount of light that is lost in the process of reflecting light incident through the light entering portion. Therefore, even if the area ratio of the light exiting area OA to the light emitting area EA is significantly small, the light guide part 170 can prevent a reduction in luminous efficiency.

Figure 11:
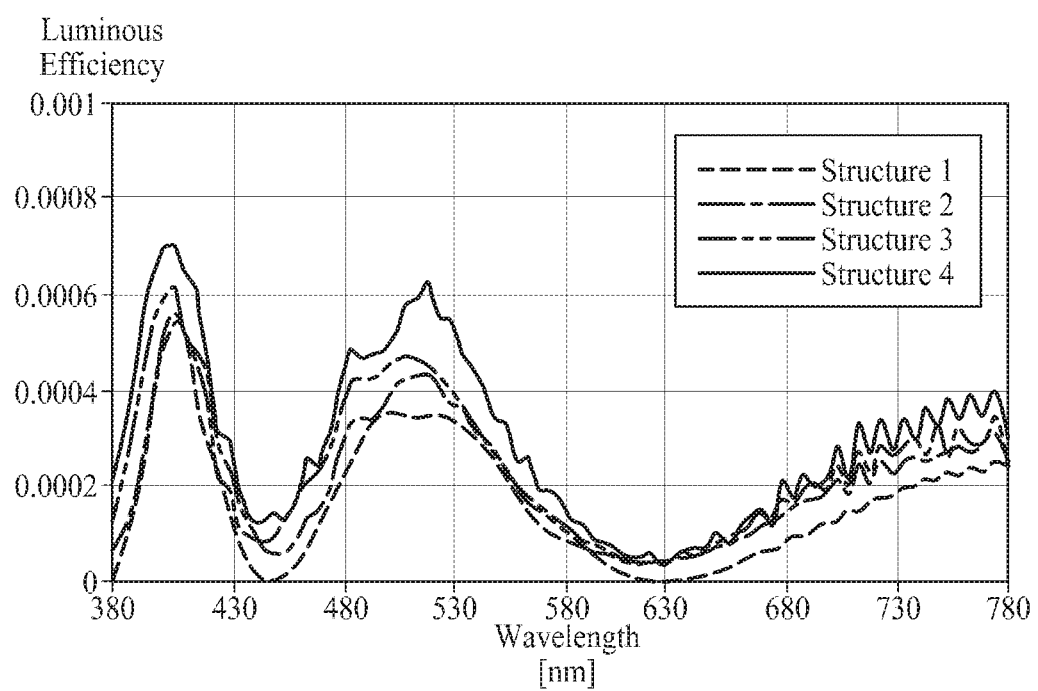
FIG. 11 is a graph showing luminous efficiency according to a structure of a light guide part in a display apparatus according to an embodiment of the present disclosure.

FIG. 11 is a graph showing luminous efficiency according to a structure of a light guide part in a display apparatus according to an embodiment of the present disclosure. Specifically, a first structure (Structure 1) indicated by the dotted line corresponds to a display apparatus including the first light blocking layer LS1 and not including the light guide part 170, a second structure (Structure 2) indicated by the alternated long and short dash line corresponds to the display apparatus 100 shown in FIG. 10, a third structure (Structure 3) indicated by the alternate long and two short dashes line corresponds to the display apparatus 100 shown in FIG. 9, and a fourth structure (Structure 4) indicated by the solid line corresponds to the display apparatus 100 shown in FIG. 4.

For example, the display apparatus of the first structure (Structure 1) does not include the light guide part 170, and the display apparatus 100 of the second structure (Structure 2) is configured such that the light guide part 170 has a hemispherical shape, the display apparatus 100 of the third structure (Structure 3) is configured such that the light guide part 170 has a shape of a truncated cone, and the display apparatus 100 of the fourth structure (Structure 4) is configured such that the light guide part 170 has a funnel shape. In addition, it is assumed that the first to fourth structures are the same except a configuration of the light guide part 170. In addition, in the graph shown in FIG. 11, the horizontal axis represents wavelength and the vertical axis represents a relative value of luminous efficiency.

Referring to FIG. 11, the display apparatus 100 of the fourth structure (Structure 4) has luminous efficiency higher than the first to third structures (Structure 1, Structure 2, and Structure 3) at a wavelength of 550 nm. The display apparatus 100 of the fourth structure (Structure 4) can have an average of luminous efficiency at wavelengths of 380 nm to 780 nm higher than the first to third structures (Structure 1, Structure 2, and Structure 3). The display apparatus 100 of the third structure (Structure 3) can have an average of luminous efficiency at the wavelengths of 380 nm to 780 nm higher than the first and second structures (Structure 1 and Structure 2). Finally, the display apparatus 100 of the second structure (Structure 2) can have an average of luminous efficiency at the wavelengths of 380 nm to 780 nm higher than the first structure (Structure 1).

Therefore, in the case where the light guide part 170 has a funnel shape, the light path can be shortened and the number of times of reflection by the light guide part 170 and the cathode electrode CE can be reduced to improve luminous efficiency of the display apparatus 100, as compared with the case where the light guide part 170 has a funnel shape.

Also, in the case where the light guide part 170 has the shape of a truncated cone, luminous efficiency of the display apparatus 100 can be enhanced, as compared with a case where the light guide part 170 has the hemispherical shape.

Figure 12:
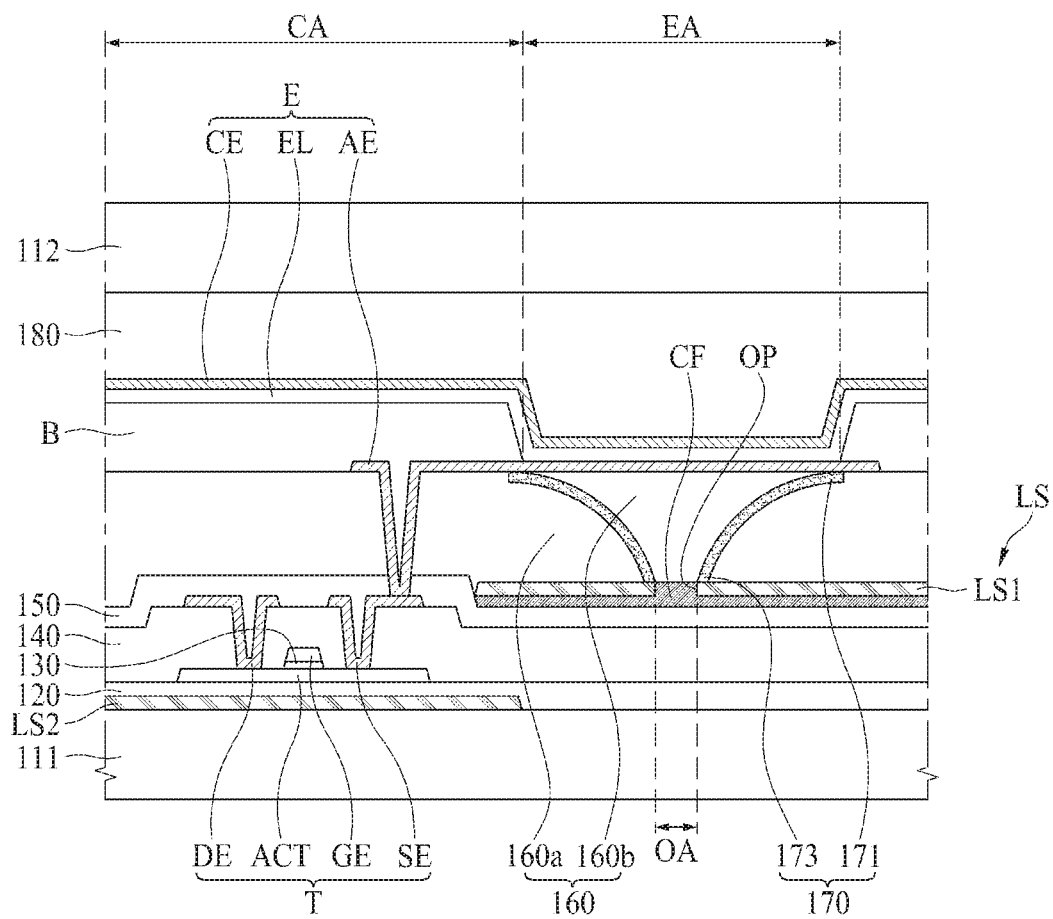
FIG. 12 shows a fifth example of the cross-sectional view taken along line I-I of FIG. 3.

FIG. 12 is a fifth example of the cross-sectional view taken along line I-I of FIG. 3.

Referring to FIG. 12, the color filter CF can be additionally disposed over one surface of the first light blocking layer LS1 overlapping the light emitting area EA. Specifically, the color filter CF can be disposed over the passivation layer 150 so as to overlap the light emitting area EA. The first light blocking layer LS1 can be disposed over the color filter CF so as to overlap the light emitting area EA. That is, the first light blocking layer LS1 has the opening OP to thereby form at least one light exiting area OA overlapping the light emitting area EA. Further, a portion of the color filter CF can be inserted in the opening OP and disposed over the same layer as the first light blocking layer LS1.

The light guide part 170 can be provided between the light emitting device E and the first light blocking layer LS1. The light guide part 170 can be disposed such that the light entering portion 171 faces the light emitting device E so light generated in the light emitting device E can be incident thereon. The light guide part 170 can be disposed such that the light exiting portion 173 faces the first light blocking layer LS1 and, in particular, such that the light existing portion 173 overlaps the opening OP, i.e., the light existing area OA. The light guide part 170 can exit light to the outside through the light existing portion 173. Thus, the light guide part 170 can guide light existing from the light emitting device E to the light existing area EA.

Further, since the first light blocking layer LS1 and the color filter CF are disposed to overlap the light guide part 170 with reference to the light existing direction, light incident on the light guide part 170 from the outside can be blocked, further preventing reflection of external light on the light guide part 170.

Figure 13:
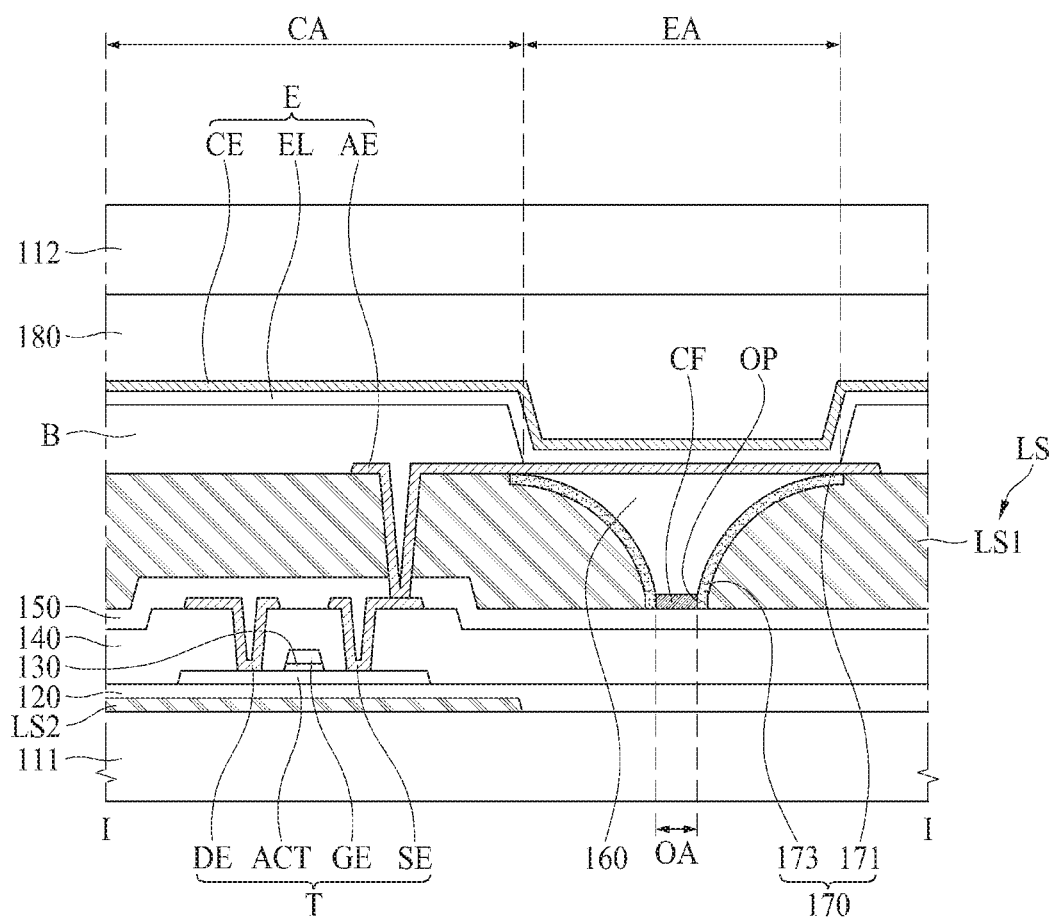
FIG. 13 shows a sixth example of the cross-sectional view taken along line I-I of FIG. 3.

FIG. 13 is a sixth example of the cross-sectional view taken along line I-I of FIG. 3.

Referring to FIG. 13, the first light blocking layer LS1 can be disposed at the circuit area CA as well as at the light emitting area EA.

The first light blocking layer LS1 can be an organic layer including a light absorbing material, for example, a black dye. Here, the first light blocking layer LS1 can be disposed in the circuit area CA to planarize the upper end of the thin film transistor T. Here, the first light blocking layer LS1 can include a contact hole through which the anode electrode AE passes. That is, the first light blocking layer LS1 can simultaneously serve as the planarization layer 160 as well as the light blocking role in the circuit area CA.

In addition, the first light blocking layer LS1 can be disposed in the light emitting area EA and have at least one opening OP. The at least one opening OP of the first light blocking layer LS1 can correspond to at least one light exiting area OA. Unlike the first light blocking layer LS1 illustrated in FIG. 4, the first light blocking layer LS1 of FIG. 13 can have a sufficient thickness to cover the light guide part 170 from the side of the light exiting portion 173 to the side of the light entering portion 173.

The first light blocking layer LS1 can be provided in the circuit area CA and at the light emitting area EA to provide a space in which the light guide part 170 is inserted. That is, the first light blocking layer LS1 can serve as a frame for the light guide part 170 to be disposed in the light emitting area EA.

When the light guide part 170 is disposed over the first light blocking layer LS1, the planarization layer 160 can be provided over the light guide part 170 so that an upper surface thereof is planarized. Here, the first light blocking layer LS1 and the planarization layer 160 can provide a planarized upper surface.

In the display apparatus 100 according to the sixth exemplary embodiment of the present disclosure, one component, that is, the first light blocking layer LS1, can serve to block light and planarize the surface. The display apparatus 100 according to the sixth embodiment of the present disclosure is simplified in structure, thereby simplifying the process.

Figure 14:
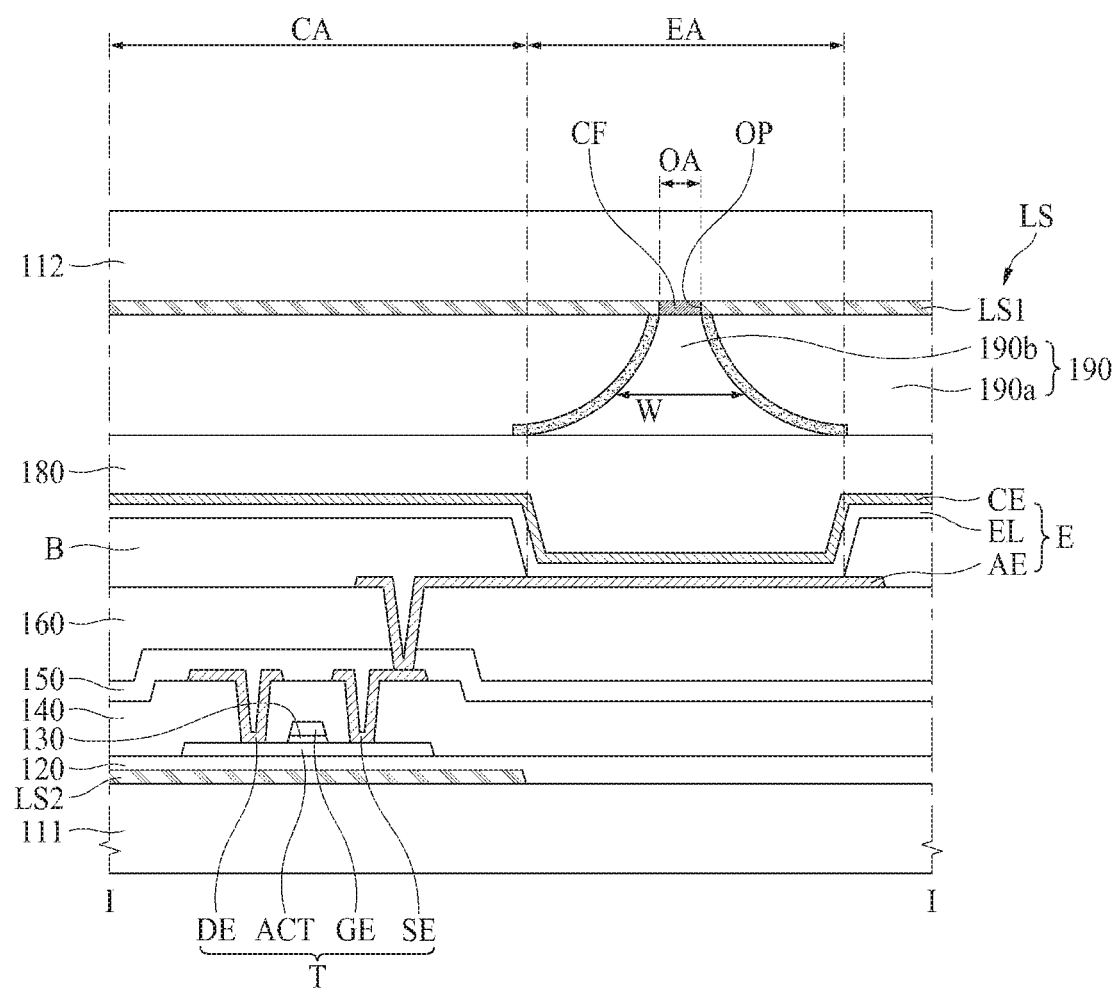
FIG. 14 shows a seventh example of the cross-sectional view taken along line I-I of FIG. 3.

FIG. 14 is a seventh example of the cross-sectional view taken along line I-I of FIG. 3.

In FIGS. 3 to 5 and 8 to 13, the display apparatus 100 is realized as a bottom emission type but is not limited thereto. The display apparatus 100 can also be realized as a top emission type.

Referring to FIG. 14, the display apparatus 100 realized as the top emission type can include a first substrate 111, a second substrate 112, a buffer layer 120, a thin film transistor T, and a gate insulating layer 130, an interlayer insulating layer 140, a passivation layer 150, a first planarization layer 160, a light emitting device E, a bank B, a light blocking layer LS, a light guide part 170, a second planarization layer 190, and a color filter CF. The display apparatus 100 can further include an encapsulation layer 180.

The first substrate 111, the second substrate 112, the buffer layer 120, the thin film transistor T, the gate insulating layer 130, the interlayer insulating layer 140, the passivation layer 150, the light emitting device E, the bank B, and the encapsulation layer 180 are substantially the same as those illustrated in FIG. 4, and thus, a detailed description thereof will be omitted or may be brief.

Hereinafter, only the first planarization layer 160, the light blocking layer LS, the light guide part 170, and the color filter CF will be described in detail, and here, differences to the first planarization layer 160, the light blocking layer LS, the light guide part 170, and the color filter CF illustrated in FIG. 4 will be mainly described. Duplicated descriptions will be omitted or may be brief.

The first planarization layer 160 can be disposed over the first substrate 111 and can cover the thin film transistor T disposed in the circuit area CA. Specifically, the first planarization layer 160 can be provided over the passivation layer 150 to planarize the top of the thin film transistor T. The first planarization layer 160 can include a contact hole through which the anode electrode AE passes. Here, the contact hole of the first planarization layer 160 can be connected to the contact hole of the passivation layer 150 to pass through the anode electrode AE. Unlike the first planarization layer 160 illustrated in FIG. 4, the first planarization layer 160 does not have the light guide part 170 inserted therein.

The second planarization layer 190 can be disposed over the encapsulation layer 180. The light guide part 170 can be inserted into the second planarization layer 190, and the upper surface of the second planarization layer 190 can be planarized by filling a step generated due to the light guide part 170.

The light blocking layer LS can include a first light blocking layer LS1 and a second light blocking layer LS2.

The first light blocking layer LS1 can be disposed between the light emitting device E and the second substrate 112. Specifically, the first light blocking layer LS1 can be disposed over the second planarization layer 190.

The first light blocking layer LS1 is disposed at the display area AA and can have at least one opening OP. Here, at least one opening OP of the first light blocking layer LS1 can correspond to at least one light exiting area OA. The first light blocking layer LS1 can include an opening OP to form at least one light exiting area OA in the light emitting area EA. The first light blocking layer LS1 can be disposed in a remaining region except for at least one light emitting region OA of the display area AA.

According to an example, the first light blocking layer LS1 can include a light blocking material or a light absorbing material. Since the first light blocking layer LS1 overlaps the light guide part 170, external light can be prevented from being reflected by the light guide part 170. Specifically, the light guide part 170 can be formed of a material that reflects light to guide the light emitted from the light emitting device E to the light exiting area OA. Accordingly, the first light blocking layer LS1 covers the light guide part 170 based on a light exiting direction to block light incident on the light guide part 170, thereby preventing external light from being reflected on the light guide part 170. Therefore, the first light blocking layer LS1 can reduce external light reflectance of the display apparatus 100 to improve reflection visibility, reduce power consumption, and improve luminance efficiency. In addition, the first light blocking layer LS1 prevents light emitted from each of the plurality of light emitting devices E from being mixed with each other, thereby improving light leakage and degradation of visibility.

According to an example, the area of the light exiting area OA can be smaller than the area of the light emitting area EA. Specifically, a portion of the light emitting area EA can overlap the first light blocking layer LS1, and the other portion of the light emitting area EA can overlap the opening OP of the first light blocking layer LS1. Here, the opening OP of the first light blocking layer LS1 can correspond to the light exiting area EA. Therefore, the area of the light exiting area OA can be smaller than the area of the light emitting area EA, and external light reflectance of the display apparatus 100 can be determined according to an area ratio of the light exiting area OA to the light emitting area EA.

According to an example, as the area ratio of the light exiting area OA to the light emitting area EA is smaller, the external light reflectance of the display apparatus 100 can decrease. Specifically, the light emitting device E can generate light and reflect external light. For example, the light emitting efficiency can be improved as the exposed area of the light emitting device E in the light exiting direction is increased, but the external light reflectance can also be increased at the same time and reflection visibility can be deteriorated. Therefore, the display apparatus 100 according to the present disclosure covers the light emitting area EA except for the light exiting area OA with the first light blocking layer LS1, thereby minimizing an exposed area of the light emitting device E in the light exiting direction. It is possible to reduce the external light reflectance, thereby improving the reflection visibility. In addition, since the display apparatus according to the present disclosure can reduce the external light reflectance through the first light blocking layer LS1, the display apparatus may not include a separate polarization layer or a polarization conversion layer, and can be manufactured to have a high polarization layer and solve the problem of high manufacturing cost for providing a polarization layer. In addition, the display apparatus 100 according to the present disclosure can include the light guide part 170, thereby preventing a decrease in luminous efficiency due to a decrease in the area ratio of the light exiting area OA to the light emitting area EA.

The second light blocking layer LS2 can be disposed over the first substrate 111 to overlap the thin film transistor T. The second light blocking layer LS can be disposed at the circuit area CA in which the thin film transistor T is disposed. The second light blocking layer LS2 can be disposed over an upper surface of the first substrate 111. For example, the second light blocking layer LS2 can be formed by depositing a metal on the first substrate 111 and then performing exposure patterning.

According to an example, the display apparatus 100 can be disposed in the display area AA excluding the light exiting area OA through the first light blocking layer LS1 and disposed in the circuit area CA through the second light blocking layer LS2. Therefore, as the display apparatus 100 according to the present disclosure is entirely disposed at the other remaining display area AA excluding the light exiting area OA through the first and second light blocking layers LS1 and LS2, external light reflectance can be minimized and reflection visibility can be improved.

The light guide part 170 can guide light emitted from the light emitting device E to the at least one light exiting area OA. The light guide part 170 can be disposed between the second substrate 112 and the light emitting device E. Specifically, the light guide part 170 can be disposed over the same layer as the second planarization layer 190. The light guide part 170 can be inserted into the second planarization layer 190 to overlap the remaining area of the light emitting area EA except for the light exiting area OA. For example, a portion 190a of the second planarization layer 190 can be provided in the circuit area CA and also at the light emitting area EA to provide a space for inserting the light guide part 170. A portion 190a of the second planarization layer 190 provided in the light emitting area EA can serve as a frame for arranging the light guide part 170. Here, a height of the portion 190a of the second planarization layer 190 can correspond to a height of the light guide part 170. In addition, when the light guide part 170 is disposed at the portion 190a of the second planarization layer 190, the other portion 190b of the second planarization layer 190 can cover the light guide portion 170 such that an upper surface of the second planarization layer 190 is planarized. That is, the portion 190a of the second planarization layer 190 formed first at the circuit area CA and the other portion 190b of the second planarization layer 190 formed later at the light emitting area EA provide a planarized upper surface.

The light guide part 170 can include a light entering portion 171 on which light generated in the light emitting device E is incident, and a light exiting portion 173 from which incident light is exited.

A distance from the light guide part 170 to the light emitting device E can be increased from the light entering portion 171 to the light exiting portion 173. When the display apparatus 100 is a top emission type, the light guide part 170 can be disposed such that the light entering portion 171 faces the first substrate 111 and the light exiting portion 173 faces the second substrate 112, so that light emitted from the light emitting device E can be emitted to the outside through the second substrate 112.

The color filter CF can be disposed between the light emitting device E and the second substrate 112. Specifically, the color filter CF can overlap the at least one light exiting area OA on the second planarization layer 190. At least one color filter CF can be disposed to correspond to each of the at least one light exiting area OA.

The color filter CF can be inserted into the opening OP of the first light blocking layer LS1. That is, the color filter CF can be disposed at the light exiting area OA over the same layer as the first light blocking layer LS1. The light exited from the light exiting portion 173 of the light guide part 170 can entirely pass through the color filter CF. The color filter CF can be disposed to correspond to at least one light exiting area OA to convert light emitted from the light emitting device E into light of a different color or allow only a portion of the light emitted from the light emitting device E to be transmitted therethrough.

When the display apparatus 100 is a top emission type, the second substrate 112 on which the first light blocking layer LS1, the second planarization layer 190, and the color filter CF are formed can be attached to the first substrate 111 on which the other components are formed.

Alternatively, the second planarization layer 190, the light guide part 170, the first light blocking layer LS1, and the color filter CF can be provided over the first substrate 111 over which the light emitting device E and the encapsulation layer 180 are provided. Thereafter, the second substrate 112 can be attached to the first light blocking layer LS1 and the color filter CF.

Figure 15A:
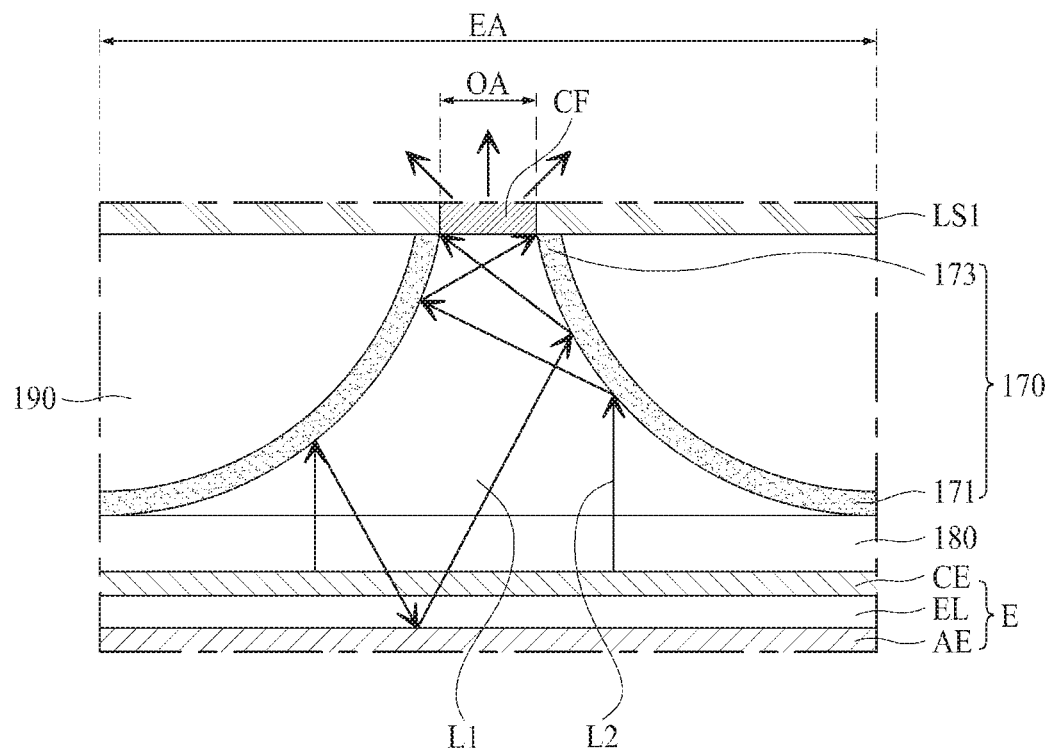
FIGS. 15A and 15B are views illustrating a path along which light is emitted and a path along which external light is reflected or absorbed in the display apparatus of FIG. 14.
Figure 15B:
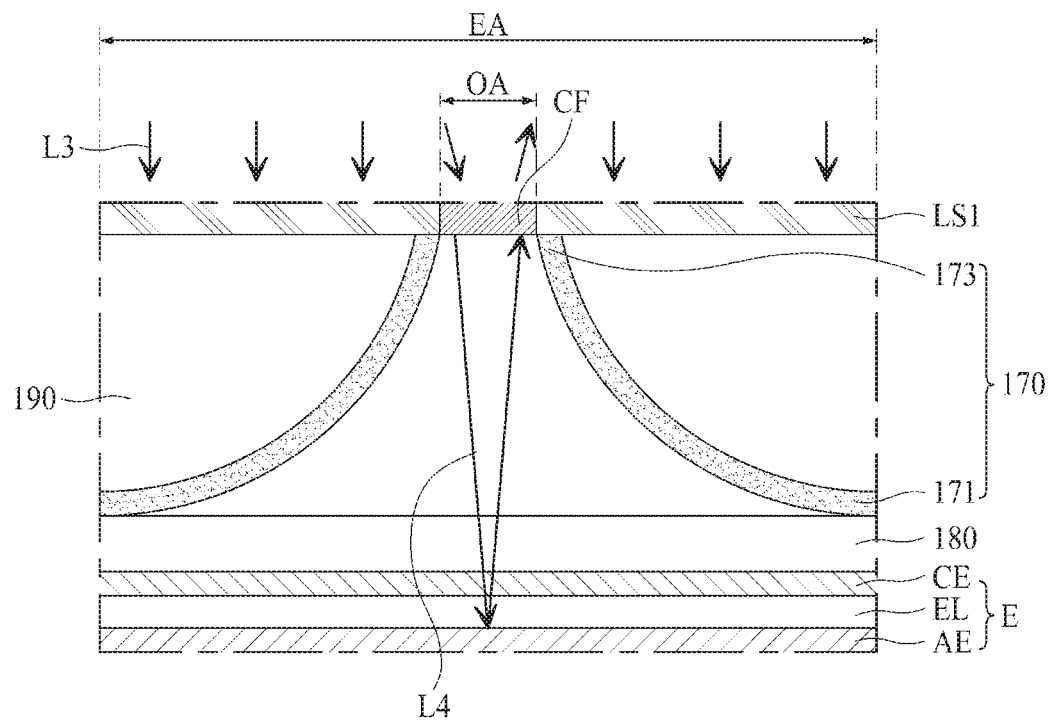

FIGS. 15A and 15B are diagrams illustrating a path in which light is emitted and a path in which external light is reflected or absorbed in the display apparatus of FIG. 14. Specifically, FIG. 15A is a view illustrating a path in which light generated in the light emitting device E is emitted, and FIG. 15B is a view in which external light is absorbed by the first light blocking layer LS1 or reflected by the light emitting device E.

In FIG. 15A, first and second lights L1 and L2 generated in the light emitting device E are incident on the light entering portion 171 of the light guide part 170 and the light can be reflected by the light guide part 170 and the anode electrode AE and guided to the light exiting portion 173. When the display apparatus 100 is a top emission type, the anode electrode AE of the light emitting device E can be formed of a metal material having high reflectance such as aluminum (Al), silver (Ag), or an Ag alloy.

For example, the first light L1 can be generated by the light emitting device E and can be incident on the light entering portion 171 of the light guide part 170. The first light L1 incident on the light entering portion 171 can be reflected by one side of the light guide part 170 to travel to the light emitting device E. In addition, the first light L1 can be reflected by the anode electrode AE of the light emitting device E to travel to the other side of the light guide part 170. In addition, the first light L1 can be reflected by the other side of the light guide part 170 and guided to the light exiting portion 173 of the light guide part 170. Finally, the first light L1 can pass through the color filter CF connected to the light exiting portion 173 of the light guide part 170, and colored light according to the color filter CF can be output.

In addition, the second light L2 can be generated by the light emitting device E and can be incident on the light entering portion 171 of the light guide part 170. The second light L1 incident on the light entering portion 171 can be reflected by one side of the light guide part 170 to travel to the other side of the light guide part 170. In addition, the second light L2 can be reflected by one side of the light guide part 170 and guided to the light exiting portion 173 of the light guide part 170. Finally, the second light L2 can pass through the color filter CF connected to the light exiting portion 173 of the light guide part 170, and colored light according to the color filter CF can be output.

As described above, the light guide part 170 can concentrate light incident through the light entering portion 171 to the light exiting portion 173. Therefore, even if the area ratio of the light exiting area OA to the light emitting area EA is significantly smaller, the display apparatus 100 can concentrate light such that the amount of light exited to the light exiting area OA is substantially the same as the amount of light generated in the light emitting area EA. That is, the display apparatus 100 can minimize the amount of light lost in the process of reflecting light incident through the light entering portion 171. As a result, the display apparatus 100 according to the present disclosure can include the light guide part 170, thereby preventing a decrease in luminous efficiency.

In FIG. 15B, third and fourth lights L3 and L4 incident from the outside can be absorbed by the first light blocking layer LS1 or can be reflected by the light emitting device E.

For example, the third light L3 can be incident from the outside to reach the first light blocking layer LS1. The third light L3 can be absorbed by the first light blocking layer LS1, so that is may not be reflected by the first light blocking layer LS1.

In addition, the fourth light L4 can be incident from the outside and pass through the color filter CF disposed at the opening OP of the first light blocking layer LS1. The fourth light L4 passing through the color filter CF can have a color according to the color filter CF and reach the light emitting device E. In addition, the fourth light L4 can be reflected by the anode electrode AE of the light emitting device E and can be exited through the color filter CF. Here, the finally exited fourth light L4 can pass through the color filter CF twice, so that the amount of light can be reduced.

As such, the first light blocking layer LS1 can cover the display area AA except for the light exiting area OA. Accordingly, the first light blocking layer LS1 can minimize an exposed area of the light emitting device E in the light exiting direction, and light incident from the outside in the display area AA except the light exiting area OA can be prevented from being reflected by the light emitting device E. In addition, the first light blocking layer LS1 can prevent the light incident from the outside from being reflected by the light guide part 170. As a result, the display apparatus according to the present disclosure can reduce an area ratio of the light exiting area OA to the light emitting area EA to reduce external light reflectance and improve reflection visibility.

Meanwhile, although one light guide part 170 is disposed at one subpixel in FIGS. 3 to 5 and 8 to 14, the present disclosure is not limited thereto. A plurality of light guide parts 170 can be disposed in one subpixel. Hereinafter, a description will be given with reference to FIGS. 16 and 17.

Figure 16:
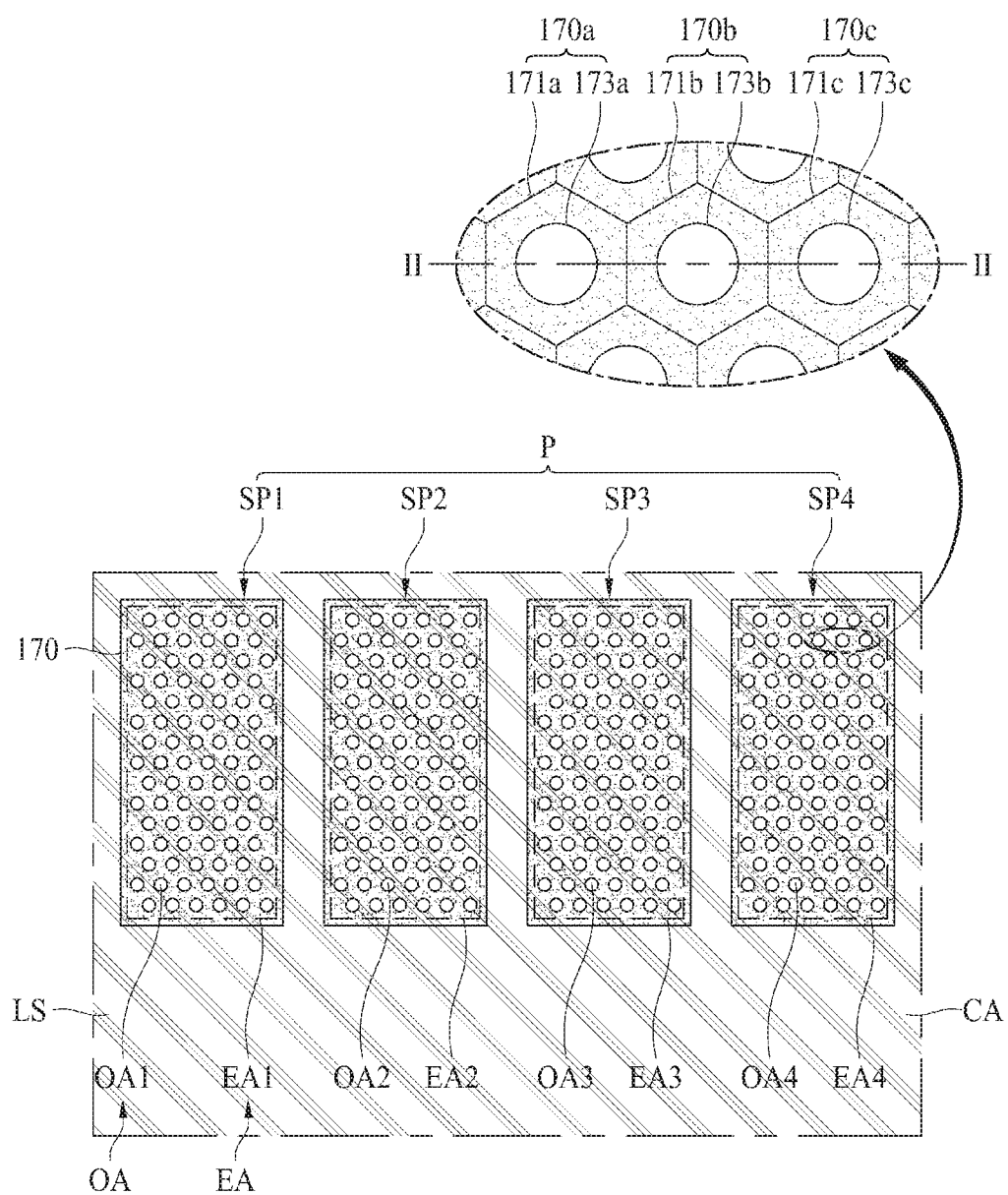
FIG. 16 shows another example of a plan view of FIG. 2.
Figure 17:
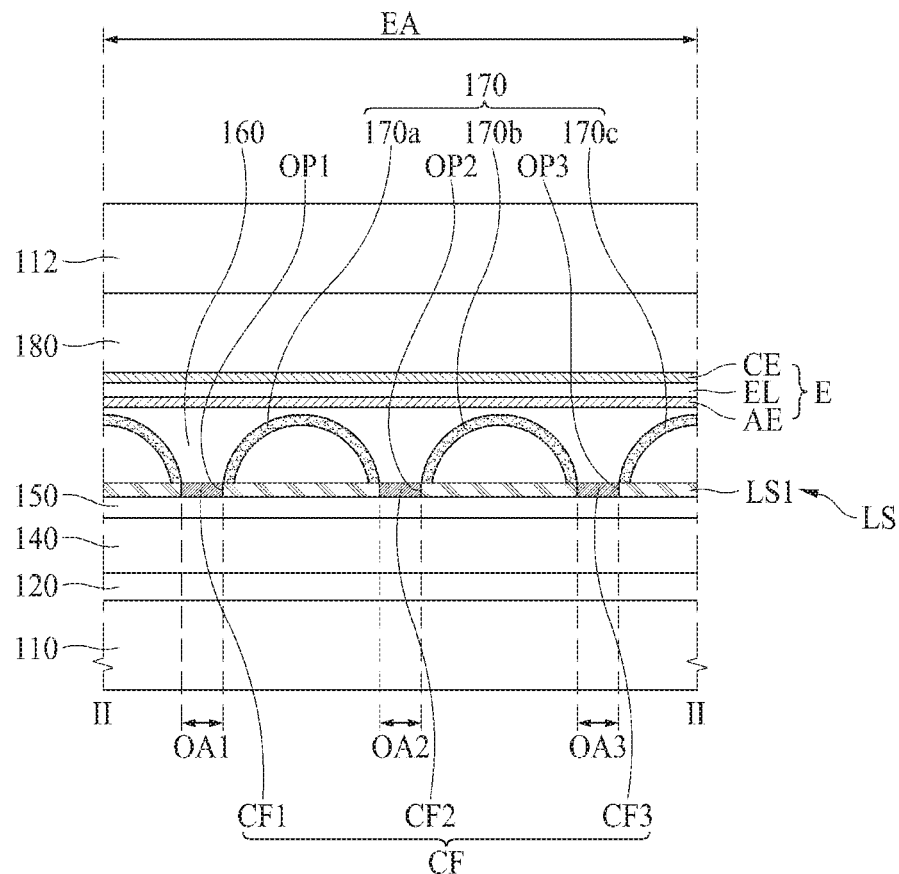
FIG. 17 shows an example of a cross-sectional view of FIG. 16 taken along line II-II.

FIG. 16 is another example of a plan view of a pixel of FIG. 2, and FIG. 17 is an embodiment of a cross-sectional view taken along line II-II of FIG. 16.

Referring to FIG. 16, pixels P having a circuit area CA and a light emitting area EA can be provided in the display area AA of the display apparatus 100. Each of the pixels P can include a first subpixel SP1, a second subpixel SP2, a third subpixel SP3, and a fourth subpixel SP4. The first subpixel SP1 emits red light, the second subpixel SP2 emits green light, the third subpixel SP3 emits blue light, and the fourth subpixel SP4 emits white light, but the present disclosure is not limited thereto. The arrangement order of each subpixel SP1, SP2, SP3, and SP4 can be variously changed.

Each subpixel SP1, SP2, SP3, SP4 can include a light emitting area EA and a plurality of light exiting areas OA. The light emitting area EA corresponds to an area in which the light emitting device E generates light, and the plurality of light exiting areas OA correspond to an area in which light exited from the light emitting device E is emitted to the outside.

Specifically, the first subpixel SP1 can include a first light emitting area EA1 and a plurality of first light exiting areas OA1 disposed in the first light emitting area EA1. The second subpixel SP2 can include a second light emitting area EA2 and a plurality of second light exiting areas OA2 disposed in the second light emitting area EA2. The third subpixel SP3 can include a third light emitting area EA3 and a plurality of third light exiting areas OA3 disposed in the third light emitting area EA3. The fourth subpixel SP4 can include a fourth light emitting area EA4 and a plurality of fourth light exiting areas OA4 disposed in the fourth light emitting area EA4.

Referring to FIG. 17, the display apparatus 100 can include a first substrate 111, a second substrate 112, a buffer layer 120, a thin film transistor T, a gate insulating layer 130, an interlayer insulating layer 140, a passivation layer 150, a planarization layer 160, a light emitting device E, a bank B, a light blocking layer LS, a light guide part 170, and a color filter CF. The display apparatus 100 can further include an encapsulation layer 180.

The first substrate 111, the second substrate 112, the buffer layer 120, the thin film transistor T, the gate insulating layer 130, the interlayer insulating layer 140, the passivation layer 150, the planarization layer 160, the light emitting device E, the bank B, and the encapsulation layer 180 shown in FIG. 17 are substantially the same as those shown in FIG. 4, and thus, a detailed description thereof will be omitted or may be brief.

Hereinafter, only the light blocking layer LS, the light guide part 170, and the color filter CF will be described in detail, and here, differences to the light blocking layer LS, the light guide part 170, and the color filter CF shown in FIG. 4 will be mainly described. Duplicated descriptions will be omitted or may be brief.

The light blocking layer LS can include a first light blocking layer LS1 disposed in the light emitting area EA and a second light blocking layer LS2 disposed in the circuit area CA. The first light blocking layer LS1 can include a plurality of openings OP provided in one light emitting area EA.

According to an example, the first light blocking layer LS1 can be disposed at one light emitting area EA and can have first to third openings OP1, OP2, and OP3. The first to third openings OP1, OP2, and OP3 of the first light blocking layer LS1 can correspond to the first to third light exiting areas OA1, OA2, and OA3. The first light blocking layer LS1 includes the first to third openings OP1, OP2, and OP3, thereby forming the first to third light exiting areas OA1, OA2, and OA3 in one light emitting area EA. As a result, the first light blocking layer LS1 can be disposed at the other remaining light emitting area EA except for the first to third light exiting areas OA1, OA2, and OA3.

The light guide part 170 can be provided in plurality at one light emitting area EA to guide light exited from the light emitting device E to the plurality of light exiting areas OA. Specifically, the light guide part 170 can include the first to third light guide parts 170a, 170b, and 170c guiding the light exited from the light emitting device E to the first to third light exiting areas OA1, OA2, and OA3. Here, the first to third light exiting areas OA1, OA2, and OA3 can be disposed at one light emitting area EA.

The first to third light guide parts 170a, 170b, and 170c can be inserted into the planarization layer 160 to correspond to the first to third light exiting areas OA1, OA2, and OA3, respectively. In addition, the light entering portions 171a, 171b, and 171c of the first to third light guide parts 170a, 170b, and 170c can allow light generated in one light emitting device E to be incident thereon. That is, the light generated in the light emitting device E can be incident to each of the first to third light guide parts 170a through the light entering portions 171a, 171b, and 171c of the first to third light guide parts 170a, 170b, and 170c. Light incident on each of the first to third light guide parts 170a, 170b, and 170c can be exited to the outside of the first to third light guide parts 170a, 170b, and 170c through the light exiting portions 173a, 173b, and 173c of the first to third light guide parts 170a, 170b, and 170c.

According to one example, the light entering portions 171a, 171b, and 171c of the first to third light guide parts 170a, 170b, and 170c can have a polygonal shape. For example, the light entering portions 171a, 171b, and 171c of the first to third light guide parts 170a, 170b, and 170c can have a hexagonal shape as illustrated in FIG. 14. Here, the number of the light guide parts 170 disposed in one light emitting area EA can be maximized. In addition, a space may not occur between the plurality of light guide parts 170 disposed at one light emitting area EA. If a space occurs between the plurality of light guide parts 170 disposed in one light emitting area EA, light incident on the space may not be exited to the light exiting area OA, and thus light efficiency can be reduced. In the present disclosure, the light entering portion 171 of the light guide part 170 has a hexagonal shape, so that no space occurs between the plurality of light guide parts 170 disposed in one light emitting area EA. Accordingly, the present disclosure can minimize loss of light generated in the light emitting device E.

According to one example, the light exiting portions 173a, 173b, and 173c of the first to third light guide parts 170a, 170b, and 170c can have a smaller area than the light entering portions 171a, 171b, and 171c.

According to one example, the light exiting portions 173a, 173b, and 173c of each of the first to third light guide parts 170a, 170b, and 170c can have a square or circular shape. For example, the light exiting portions 173a, 173b, and 173c of the first to third light guide parts 170a, 170b, and 170c can have a circular shape as illustrated in FIG. 14. The light exiting portions 173a, 173b, and 173c of the first to third light guide parts 170a, 170b, and 170c can have a shape corresponding to the first to third light exiting areas OA1, OA2, and OA3 disposed in the light emitting area EA. That is, when the first to third light exiting areas OA1, OA2, and OA3 have a circular shape, the light exiting portions 173a, 173b, and 173c of the first to third light guide parts 170a, 170b, and 170c can be have a circular shape at positions corresponding to the first to third light exiting areas OA1, OA2, and OA3. However, the present disclosure is not limited thereto.

According to an example, the light entering portions 171a, 171b, and 171c of the first to third light guide parts 170a, 170b, and 170c can be spaced apart from the light emitting device E by a predetermined distance d. As a result, light lost in the light entering portions 171a, 171b, and 171c of the first to third light guide parts 170a, 170b, and 170c can be minimized. Specifically, the first to third light guide parts 170a, 170b, and 170c can have a funnel shape as illustrated in FIG. 17. The light entering portions 171a, 171b, and 171c of the first to third light guide parts 170a, 170b, and 170c have a very small gradient. If there is no distance between the first to third light guide parts 170a, 170b and 170c and the light emitting device E, the light incident on the light entering portions 171a, 171b and 171c having a small gradient can be partially lost as the number of reflections between the first to third light guide parts 170a, 170b, and 170c and the cathode electrode CE is increased. In the display apparatus 100 according to the present disclosure, the first to third light guide parts 170a, 170b, and 170c and the light emitting device E are spaced apart from each other, thereby reducing the number of reflections of light incident on the light entering portions 171a, 171b, and 171c and improving light efficiency.

The color filter CF can include first to third color filters CF1, CF2, and CF3 overlapping the first to third light exiting areas OA1, OA2, and OA3, respectively. Specifically, the first color filter CF1 is inserted into the first opening OP1 of the first light blocking layer LS1 so as to overlap the first light exiting area OA1, and the second color filter CF2 is inserted into the second opening OP2 of the first light blocking layer LS1 so as to overlap the second light exiting area OA2, and the third color filter CF3 is inserted into the third opening OP3 of the first light blocking layer LS1 so as to overlap the third light exiting area OA3. The first to third color filters CF1, CF2, and CF3 can be disposed at the first to third light exiting areas OA1, OA2, and OA3, respectively, on the same layer as the first light blocking layer LS1.

The light exited from the light exiting portions 173a, 173b, and 173c of the first to third light guide parts 170a, 170b, and 170c can pass through the first to third color filters CF1, CF2, and CF3, respectively. The first to third color filters CF1, CF2, and CF3 can convert light emitted from the light emitting device E into light of another color or allow only a portion of the light emitted from the light emitting device E to be transmitted therethrough. The color filter CF can include a red color filter, a green color filter, and a blue color filter. The first subpixel SP1 can include a red color filter. The red color filter can be disposed to correspond to the light exiting area OA and can allow only red light of the light emitted from the light emitting device E to be transmitted therethrough. The second subpixel SP2 can include a green color filter. The green color filter can be disposed to correspond to the light exiting area OA and can allow only green light of light emitted from the light emitting device E to be transmitted therethrough. The third subpixel SP3 can include a blue color filter. The blue color filter can be disposed to correspond to the light exiting area OA and can allow only blue light of light emitted from the light emitting device E to be transmitted therethrough. The fourth subpixel SP4 can be realized without a color filter.

Meanwhile, the first to third color filters CF1, CF2, and CF3 overlapping one light emitting area EA can be color filters of the same color. For example, when the first to third color filters CF1, CF2, and CF3 are disposed at the first subpixel SP1, all of the first to third color filters CF1, CF2, and CF3 can be red color filters. Accordingly, the first subpixel SP1 can emit red light.

As shown in FIGS. 16 and 17, the display apparatus 100 in which the plurality of light guide parts 170 are disposed in one light emitting area EA can be thinner than the display apparatus 100 in which one light guide part 170 is disposed in one light emitting area EA.

Specifically, the thickness of the planarization layer 160 can be determined according to the height H of the light guide part 170. When one light guide part 170 is disposed in one light emitting area EA, the distance from the light entering portion 171 to the light exiting portion 173 of the light guide part 170 is large. As a result, the height H of the light guide part 170 is increased and the thickness of the planarization layer 160 is increased. Meanwhile, when the plurality of light guide parts 170 are disposed in one light emitting area EA, the distance from the light entering portion 171 of the one light guide part 170 to the light exiting portion 173 is reduced. As a result, the height H of the light guide part 170 is reduced and the thickness of the planarization layer 160 is reduced. As a result, the display apparatus 100 in which the plurality of light guide parts 170 are disposed at one light emitting area EA can be thinner than the display apparatus in which one light guide part 170 is disposed at one light emitting area EA.

Figure 18:
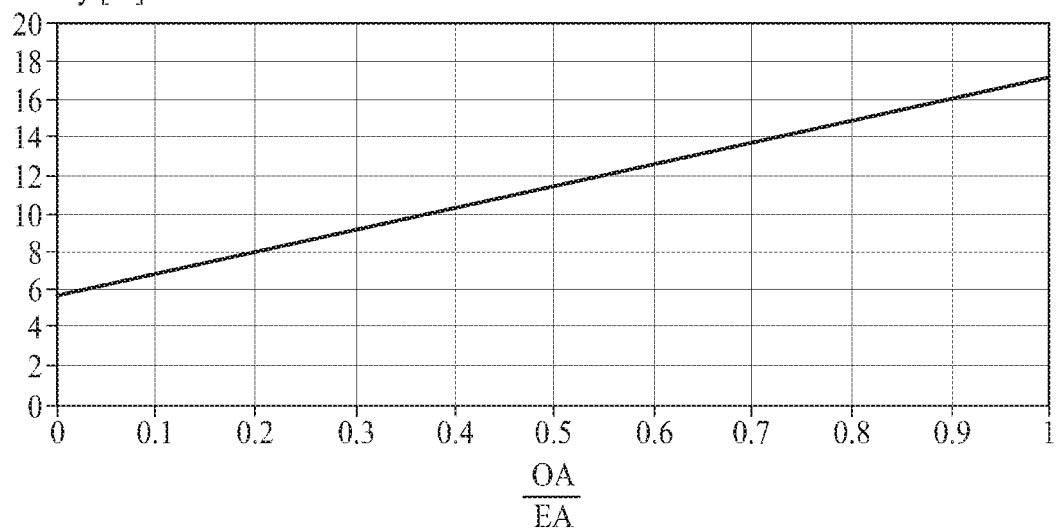
FIG. 18 is a graph showing external light reflectance according to an area ratio of a light exiting area to a light emitting area in a display apparatus according to an embodiment of the present disclosure.

FIG. 18 is a graph showing external light reflectance according to an area ratio of a light exiting area to a light emitting area in a display apparatus according to an embodiment of the present disclosure. Here, in the graph illustrated in FIG. 18, the horizontal axis represents an area ratio (OA/EA) of the light exiting area OA to the light emitting area EA and the vertical axis represents external light reflectance of the display apparatus 100. Also, in the graph illustrated in FIG. 11, when the area ratio (OA/EA) of the light exiting area OA to the light emitting area EA is 1, it indicates external light reflectance of the display apparatus not including the first light blocking layer. Also, in the graph illustrated in FIG. 18, when the area ratio (OA/EA) of the light exiting area OA to the light emitting area EA is 0, it indicates external light reflectance of the first light blocking layer LSI itself.

Referring to FIG. 18, as the area ratio (OA/EA) of the light exiting area OA to the light emitting area EA is reduced, external light reflectance of the display apparatus 100 can be reduced. For example, if the area ratio (OA/EA) of the light exiting area OA to the light emitting area EA is 0.4 or greater, the external light reflectance can be 10% or greater, and if the area ratio (OA/EA) of the light exiting area OA to the light emitting area EA is 0.2 or less, the external light reflectance can be 8% or less. Accordingly, in the display apparatus 100 according to the present disclosure, by covering the light emitting area EA excluding the light exiting area OA, the exposed area of the light emitting device E with respect to the light exiting direction can be minimized and external light reflectance can be reduced to improve reflection visibility. In addition, in the display apparatus according to the present disclosure, since the external light reflectance is reduced through the first light blocking layer LS1, a separate polarization layer or a polarization conversion layer may not be provided, and thus, high manufacturing cost for providing a polarization layer can be solved. Further, since the display apparatus 100 according to the present disclosure includes the light guide part 170, a reduction in luminous efficiency due to a reduction in the area ratio of the light exiting area OA to the light emitting area EA can be prevented.

Since the display apparatus according to the present disclosure includes the light blocking layer covering the remaining light emitting areas except the light exiting area and the light guide part guiding light emitted from the light emitting area to the light exiting area, luminous efficiency can be improved and external light reflectance can be minimized.

The display apparatus according to the present disclosure can improve luminous efficiency and minimize external light reflectance even without providing a separate polarization layer or a circularly polarized light conversion layer.

Since the display apparatus according to the present disclosure includes the light blocking layer and the light guide part, a low cost and high efficiency product can be provided.

The above-described features, structures, and effects of the present disclosure are included in at least one embodiment of the present disclosure, but are not limited to only one embodiment. Furthermore, the features, structures, and effects described in at least one embodiment of the present disclosure can be implemented through combination or modification of other embodiments by those skilled in the art. Therefore, content associated with the combination and/or modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
   a substrate having a light emitting area;
   a light emitting device disposed in the light emitting area over the substrate;
   at least one light exiting area disposed in the light emitting area;
   a first light blocking layer disposed in the light emitting area, and having an opening overlapping the at least one light exiting area; and
   a light guide part disposed in the light emitting area, and configured to guide light generated in the light emitting device to the at least one light exiting area.

2. The display apparatus of claim 1, wherein the first light blocking layer overlaps the light guide part.

3. The display apparatus of claim 1, wherein the light guide part comprises:
   a light entering portion on which the light generated in the light emitting device is incident; and
   a light exiting portion from which the light incident on the light entering portion is exited,
   wherein an area of the light exiting portion is smaller than an area of the light entering portion.

4. The display apparatus of claim 3, wherein the light exiting portion overlaps the opening of the first light blocking layer.

5. The display apparatus of claim 3, wherein the light guide part has a width decreased from the light entering portion toward the light exiting portion.

6. The display apparatus of claim 3, wherein the light guide part has a gradient increased from the light entering portion toward the light exiting portion.

7. The display apparatus of claim 3, wherein a distance from the light guide part to the light emitting device is increased from the light entering portion toward the light exiting portion.

8. The display apparatus of claim 3, wherein the light entering portion of the light guide part is spaced apart from the light emitting device.

9. The display apparatus of claim 1, wherein the light guide part is formed of a material reflecting light.

10. The display apparatus of claim 1, further comprising:
    a color filter overlapping the opening of the first light blocking layer.

11. The display apparatus of claim 10, wherein the color filter is additionally disposed on one surface of the first light blocking layer overlapping the light emitting area.

12. The display apparatus of claim 10, wherein the color filter is inserted into the opening of the first light blocking layer.

13. The display apparatus of claim 1, wherein the light guide part overlaps the light emitting area excluding the at least one light exiting area.

14. The display apparatus of claim 1, further comprising:
    a planarization layer,
    wherein the light guide part is disposed on a same layer as the planarization layer.

15. The display apparatus of claim 14, wherein the first light blocking layer is disposed over one surface of the planarization layer.

16. The display apparatus of claim 14, wherein
    a portion of the planarization layer is disposed between the substrate and the light guide part, and other portion of the planarization layer is disposed between the light emitting device and the light guide part,
    wherein the portion of the planarization layer and the other portion of the planarization layer are formed of different materials.

17. The display apparatus of claim 14, wherein the portion of the planarization layer is the first light blocking layer.

18. The display apparatus of claim 14, further comprising:
    a thin film transistor disposed between the substrate and the planarization layer; and
    a second light blocking layer covering a lower surface of the thin film transistor.

19. The display apparatus of claim 1, wherein the light guide part is disposed over the light emitting device.

20. A display apparatus comprising:
    a first light emitting area and a second light emitting area where a light emitting device is disposed;
    a light blocking layer disposed at each of the first and second light emitting areas, and having at least one opening; and
    a light guide part configured to guide light generated in the light emitting device to be exited through the at least one opening of the light blocking layer.

21. The display apparatus of claim 20, wherein the light guide part comprises:
    a light entering portion on which the light generated in the light emitting device is incident; and
    a light exiting portion from which the light incident on the light entering portion is exited,
    wherein the light exiting portion overlaps the at least one opening of the light blocking layer.

22. The display apparatus of claim 21, wherein an area of the light exiting portion is smaller than an area of the light entering portion.

23. The display apparatus of claim 20, wherein one light guide part is disposed at each of the first light emitting area and the second light emitting area.

24. The display apparatus of claim 21, wherein a plurality of light guide parts are arranged at each of the first light emitting area and the second light emitting area.

25. The display apparatus of claim 21, wherein the light entering portion of the light guide part has a hexagonal cross-section.

26. The display apparatus of claim 21, wherein the light exiting portion of the light guide part has a quadrangular or circular cross-section.

27. The display apparatus of claim 21, wherein one light guide part overlaps the first light emitting area and the second light emitting area.

28. The display apparatus of claim 21, wherein a cross-sectional shape and a size of the light exiting portion of the light guide part are respectively the same as a cross-sectional shape and a size of the opening of the light blocking layer.

29. The display apparatus of claim 21, wherein the light guide part is spaced apart from the light emitting device.

* * * * *